United States Patent
Park et al.

(10) Patent No.: US 7,825,590 B2
(45) Date of Patent: Nov. 2, 2010

(54) DUAL PANEL TYPE ORGANIC ELECTROLUMINESCENT DISPLAY DEVICE AND METHOD FOR FABRICATING THE SAME

(75) Inventors: Jae-Hee Park, Daegu (KR); Kyung-Min Park, Gyeongbuk (KR); Seok-Jong Lee, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 465 days.

(21) Appl. No.: 11/646,283

(22) Filed: Dec. 28, 2006

(65) Prior Publication Data

US 2008/0012481 A1    Jan. 17, 2008

(30) Foreign Application Priority Data

Jun. 29, 2006    (KR) .................... 10-2006-0059352

(51) Int. Cl.
*H01J 1/62* (2006.01)
(52) U.S. Cl. ..................... 313/506; 313/504
(58) Field of Classification Search .............. 313/498, 313/504, 506, 512
See application file for complete search history.

(56) References Cited

U.S. PATENT DOCUMENTS

2003/0116772 A1   6/2003   Yamazaki et al.
2003/0173564 A1   9/2003   Ko et al.

FOREIGN PATENT DOCUMENTS

| CN | 1314069 A | 9/2001 |
|---|---|---|
| CN | 1623117 A | 6/2005 |
| JP | 2004-48036 A | 2/2004 |
| JP | 2004-048036 A | 12/2004 |
| JP | 2005-175248 A | 6/2005 |

OTHER PUBLICATIONS

Office Action issued Oct. 29, 2009 in corresponding Taiwanese Application No. 095148657.

*Primary Examiner*—Vip Patel
(74) *Attorney, Agent, or Firm*—Morgan Lewis & Bockius LLP

(57) ABSTRACT

An organic electroluminescent device includes a switching element and a driving element connected to the switching element on a substrate in a pixel region, an overcoat layer on the switching element and the driving element, a first contact layer on the overcoat layer, the first contact layer being made of one of molybdenum and indium tin oxide, a cathode on the first contact layer, the cathode connected to the driving element through the first contact layer, an emitting layer on the cathode, and an anode on the emitting layer.

20 Claims, 29 Drawing Sheets

US 7,825,590 B2

DUAL PANEL TYPE ORGANIC ELECTROLUMINESCENT DISPLAY DEVICE AND METHOD FOR FABRICATING THE SAME

The present application claims the benefit of Korean Patent Application No. 10-2006-0059352 filed in Korea on Jun. 29, 2006, which is hereby incorporated by reference in its entirety.

BACKGROUND OF THE INVENTION

1. Field of the Invention

The embodiments of the invention relates to a display device, and more particularly, to a dual panel type organic electroluminescent display (ELD) device. Although embodiments of the invention are suitable for a wide scope of applications, it is particularly suitable for increasing brightness of an organic electroluminescent display device.

2. Discussion of the Related Art

In general, an organic ELD emits light by injecting electrons from a cathode and holes from an anode into an emission layer such that the electrons combine with the holes to generate an exciton, which then transitions from an excited state to a ground state. In comparison to a liquid crystal display (LCD) device, an additional light source is not necessary for the organic ELD to emit light because the transition of the exciton between the excited state and the ground state causes light to be emitted. Accordingly, the size and weight of the organic ELD is less than an LCD device. The organic ELD has other excellent characteristics, such as low power consumption, superior brightness, and a fast response time. Because of these characteristics, the organic ELD is seen as the display for the next-generation of consumer electronic applications, such as cellular phones, car navigation system (CNS), personal digital assistants (PDA), camcorders, and palmtop computers. Moreover, since fabricating the organic ELD is carried out with fewer processing steps, the organic ELD is much cheaper to produce than an LCD device.

Two different types of organic ELDs exist: passive matrix and active matrix. While both the passive matrix organic ELD and the active matrix organic ELD have a simple structure and are formed by a simple fabricating process, the passive matrix organic ELD requires a relatively large amount of power to operate. In addition, the display size of a passive matrix organic ELD is limited by the width and thickness of conductive lines used in the interconnection of the pixels. Further, as the number of conductive lines increases, the aperture ratio of a passive matrix organic ELD decreases. In contrast, active matrix organic ELDs are highly efficient and can produce a high-quality image on a large display with relatively low power.

FIG. 1 is a cross-sectional view of an organic ELD according to the related art. As shown in FIG. 1, an organic ELD 1 includes first and second substrates 12 and 28 facing each other and spaced apart from each other. An array element layer 14, including thin film transistors "T," is formed on the first substrate 12 Although not shown, the array element layer 14 further includes a gate line, a data line crossing the gate line, and a power line crossing one of the gate and data lines. The data line, gate line and power line define a pixel region "P." A first electrode 16 is on the array element 14 in each of the pixel regions "P," an organic electroluminescent (EL) layer 18 is on the first electrode 16 in each of the pixel regions "P," and a second electrode 20 on the organic EL layer 18 of all of the pixel regions "P." More specifically, the first electrode 16 of each pixel region "P" is connected to the thin film transistor "T" of each pixel region "P." The organic EL layer 18 includes red (R), green (G) and blue (B) sub-organic EL layers in the pixel regions "P."

The second substrate 28 functions as an encapsulating panel and has a recessed portion 21. A desiccant 22 is positioned in the recessed portion 21 to protect the organic ELD 1 from moisture. A seal pattern 26 is formed between the first and second substrates 12 and 28 at a periphery thereof to attach the first and second substrates 12 and 28 to each other.

FIG. 2 is an equivalent circuit diagram of an organic ELD according to the related art. As shown in FIG. 2, a gate line 42 and a data line 44 crossing the gate line 42 are formed on a substrate 32 to define a pixel region "P." A power line 55 that crosses the data line 44 is parallel to and spaced from the gate line 42.

A switching element "$T_S$" is connected to the gate and data lines 42 and 44 at an adjacent portion of crossing the gate and data lines 42 and 44. A driving element "$T_D$" is connected to the switching element "$T_S$." For example, the driving element "$T_D$" is a P-type thin film transistor, as shown in FIG. 2. A storage capacitor "$C_{ST}$" is formed between the switching element "Ts" and the driving element "$T_D$." A drain electrode 63 of the driving element "$T_D$" is connected to a first electrode (not shown) of an organic EL diode "E." The source electrode 66 of the driving element "$T_D$" is connected to the power line 55.

Hereinafter, an operation characteristic of the organic ELD will be explained in detail as follows. When a gate signal is applied to a gate electrode 46 of the switching element "Ts," a current signal applied to the data line 44 is changed into a voltage signal through the switching element "Ts" and is applied to the gate electrode 68 of the driving element "$T_D$." As a result, the driving element "$T_D$" is driven and the level of the current applied to the organic EL diode "E" is determined. And then, the organic EL diode "E" can embody gray scale depending on the level of the current applied to the organic EL diode. Because the signal in the storage capacitor "Cst" acts to maintain the signal of the gate electrode 68 of driving element "TD," the current level applied to the EL diode can be maintained until the next signal is applied even if the switching element "Ts" is in the OFF state.

FIG. 3 is a plan view of an organic ELD in one pixel region according to the related art. As shown in FIG. 3, a switching element "Ts," a driving element "TD" connected to the switching element "Ts," and a storage capacitor "Cst" are formed on a substrate 32 in a pixel region "P." For example, the substrate 32 includes a transparent insulating substrate, such as glass or plastic. Alternatively, the functions of the switching element "Ts" and the driving element "$T_D$" can be implemented with more than two switching elements in the pixel region "P."

A gate line 42 is formed on the substrate 32 and a data line 44 crosses the gate line 42 to define the pixel region "P." In addition, a power line 55 parallel to the data line 44 crosses the gate line 42. The switching element "Ts" includes a first gate electrode 46 connected to the gate line 42, a first semiconductor layer 50 over the first gate electrode 46, a first source electrode 56 connected to the data line 44, and a first drain electrode 60 spaced apart from the first source electrode 56. The driving element "$T_D$" includes a second gate electrode 68 connected to the first drain electrode 60, a second semiconductor layer 62 over the second gate electrode 68, a second source electrode 66 connected to the power line 55, and a second drain electrode 63. More particularly, the first drain electrode 60 and the second gate electrode 68 can be connected to each other via a contact hole 64 in an insulating material layer (not shown). Further, a first electrode 36 is connected to the second drain electrode 63 in the pixel region "P." Although not shown, a storage capacitor "Cst" includes a first storage electrode of doped silicon, a second storage electrode that is a portion of the power line 55, and an insulating material layer between the first storage electrode and the second storage electrode.

FIG. 4 is a cross-sectional view of an organic ELD along line "IV-IV" in FIG. 3. As shown in FIG. 4, the second semiconductor layer 62 is formed on the substrate 32, a gate insulating layer "GI" is formed on the second semiconductor layer 62, the second gate electrode 68 is formed on the gate insulating layer "GI" over the second semiconductor layer 62, and an interlayer insulating layer "IL" is formed on the second gate electrode 68, which includes first and second contact holes "C1" and "C2" that expose both end portions of the second semiconductor layer 62. The second source and second drain electrodes 66 and 63 are formed on the interlayer insulating layer "IL" and are connected to the second semiconductor layer 62 via the first and second contact holes "C1" and "C2." A passivation layer 68 is formed on the second source and second drain electrodes 66 and 63. The passivation layer 68 also includes a drain contact hole "C3" that exposes a portion of the second drain electrode 63. The first electrode 36 is connected to the second drain electrode 63 via the drain contact hole "C3." The organic EL layer 38 is formed on the first electrode 36, and a second electrode 80 is formed on the organic EL layer 38. The first electrode 36 and the second electrode 80 are a cathode and an anode, respectively. The first electrode 36, the organic EL layer 38, and the second electrode 80 constitute the organic EL diode "E." If the driving element "$T_D$" is an N-type TFT, the first electrode 36 and the second electrode 80 are a cathode and an anode, respectively. On the other hand, if the driving element "$T_D$" is a P-type TFT, the first electrode 36 and the second electrode 80 are an anode and a cathode, respectively.

The storage capacitor "Cst" and the driving element "TD" are disposed in a row. The second source electrode 66 is connected to the second storage electrode 55. The first storage electrode 35 is disposed under the second storage electrode 55.

FIG. 5 is a cross-sectional view of an emission region of an organic ELD according to the related art. As shown in FIG. 5, the emission region of the organic ELD 1 includes an anode 36 on the substrate 32, a hole injection layer 38a on the anode 36, a hole transport layer 38b on the hole injection layer 38a, an emitting layer 38c on the hole transport layer 38b, an electron transport layer 38d on the emitting layer 38c, an electron injection layer 38e on the electron transport layer 38d, and a cathode 80 on the electron injection layer 38e. The hole transport layer 38b and the electron transport layer 38d act to transport holes and electrons to the emitting layer 38c to improve light emitting efficiency. Further, the hole injection layer 38c between the anode 36 and the hole transport layer 38b reduces hole injecting energy, and the electron injection layer 38e between the cathode 80 and the electron transport layer 38d reduces electron injecting energy so as to increase light emitting efficiency and reduce the driving voltage.

The cathode 80 can be made of one of calcium (Ca), aluminum (Al), magnesium (Mg), silver (Ag), and lithium (Li). The anode 36 can be made of a transparent conductive material, such as indium tin oxide (ITO). Because the anode 36 is a transparent conductive material, such as ITO, which can be deposited by sputtering, layers under the anode 36, such as the emitting layer 38, may be damaged during the sputtering to form the anode 36. To prevent damage to the emitting layer 38 during sputtering of the anode, the anode 36 is not formed on the emitting layer 38 but rather the emitting layer 38 is formed on the anode 36.

When light from the emitting layer 38 is emitted toward the anode 36 formed under the emitting layer 38, the aperture region is limited due to the array element (not shown) under the anode 36. Consequently, because the above-described organic ELD according to the related art is a bottom emission type device, brightness is deteriorated due to the array element reducing the aperture regions of the device. Further, to prevent minimization of the aperture regions, the design of the array element is limited in a bottom emission type device. Furthermore, the driving element is typically P-type, which has a complicated fabrication process that reduces product yield.

SUMMARY OF THE INVENTION

Accordingly, embodiments of the invention is directed to a dual panel type organic electroluminescent display (ELD) device that substantially obviates one or more of the problems due to limitations and disadvantages of the related art.

An object of embodiments of the invention is to provide an organic ELD as a top emission type organic ELD to improve brightness.

Another object of embodiments of the invention is to provide a method of fabricating an organic ELD having a simpler production process to reduce product cost and increase yield.

Another object of embodiments of the invention is to provide an organic ELD and a method of fabricating the same that can prevent a separation of an emitting layer at a step difference of an array element layer.

Another object of embodiments of the invention is to provide an organic ELD and a method of fabricating the same that can prevent shorting between a cathode and an anode by degradation of an emitting layer and improve contact characteristics between a driving element and a cathode.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described herein, an organic electroluminescent device includes a switching element and a driving element connected to the switching element on a substrate in a pixel region, an overcoat layer on the switching element and the driving element, a first contact layer on the overcoat layer, the first contact layer being made of one of molybdenum and indium tin oxide, a cathode on the first contact layer, the cathode connected to the driving element through the first contact layer, an emitting layer on the cathode, and an anode on the emitting layer.

In another aspect, an organic electroluminescent device includes a switching element and a driving element connected to the switching element on a substrate in a pixel region, an overcoat layer on the switching element and the driving element, a contact layer made of inorganic insulating layer on the overcoat layer, wherein the overcoat layer and the contact layer has a contact hole that exposes a portion of the driving element, a cathode on the contact layer, the cathode connected to the driving element via the contact hole, an emitting layer on the cathode, and an anode on the emitting layer.

In another aspect, a method of fabricating an organic electroluminescent device includes forming a switching element and a driving element connected to the switching element on a substrate in a pixel region, forming an overcoat layer on the switching element and the driving element, forming a contact layer on the overcoat layer, wherein the contact layer is made of one of molybdenum and indium tin oxide, forming a cathode on the contact layer, the cathode connected to the driving element through the contact layer, forming an emitting layer on the cathode, and forming an anode on the emitting layer.

In another aspect, a method of fabricating an organic electroluminescent device that includes forming a switching element and a driving element connected to the switching element on a substrate in a pixel region, forming an overcoat layer on the switching element and the driving element, forming a contact layer on the overcoat layer, the contact layer including an inorganic insulating material, wherein the overcoat layer and the contact layer having a contact hole that exposes a portion of the driving element, forming a cathode on the contact layer, the cathode connected to the driving element via the contact hole, forming an emitting layer on the cathode, and forming an anode on the emitting layer.

In another aspect, a method of fabricating an organic electroluminescent device includes forming a gate line and a power line spaced apart from the gate line on a substrate, forming a gate insulating layer on the gate line and the power line, forming a data line on the gate insulating layer, the data line crossing the gate line, forming a switching element connected to the gate and data line, and a driving element connected to the switching element, forming a first passivation layer on the switching element and the driving element, the driving element including a first gate electrode, a first semiconductor layer corresponding to the first gate electrode, a first source electrode and a first drain electrode spaced apart from the first source electrode, the first source and first drain electrodes connected to end portions of the first semiconductor layer, forming an overcoat layer on the first passivation layer, etching the first passivation layer and the overcoat layer to form a contact hole that exposes a portion of the first drain electrode, forming a contact layer on the overcoat layer connected to the first drain electrode via the contact hole, wherein the contact layer is made of one of molybdenum and indium tin oxide, forming a cathode on the contact layer, the cathode connected to the first drain electrode through the contact layer, forming a second passivation layer on the cathode, etching the second passivation layer to form an opening that exposes the cathode, forming an emitting layer on the second passivation layer, the emitting layer contacting the cathode via the opening, and forming an anode on the emitting layer.

In another aspect, a method of fabricating an organic electroluminescent device includes forming a gate line and a power line spaced apart from the gate line on a substrate, forming a gate insulating layer on the gate line and the power line, forming a data line on the gate insulating layer, the data line crossing the gate line, forming a switching element connected to the gate and data line, and a driving element connected to the switching element, forming a first passivation layer on the switching element and the driving element, the driving element including a first gate electrode, a first semiconductor layer corresponding to the first gate electrode, a first source electrode and a first drain electrode spaced apart from the first source electrode, the first source and first drain electrodes connected to end portions of the first semiconductor layer, forming an overcoat layer on the first passivation layer, etching the overcoat layer to form a first contact hole that exposes a portion of the first passivation layer, forming a contact layer on the overcoat layer, the contact layer including an inorganic insulating material, etching a portion of the contact layer corresponding to the first contact hole to form a second contact hole that exposes a portion of the first drain electrode, forming a cathode on the contact layer, the cathode connected to the first drain electrode via the second contact hole, forming a second passivation layer on the cathode, etching the second passivation layer to form an opening that exposes the cathode, forming an emitting layer on the second passivation layer, the emitting layer contacting the cathode via the opening, and forming an anode on the emitting layer.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
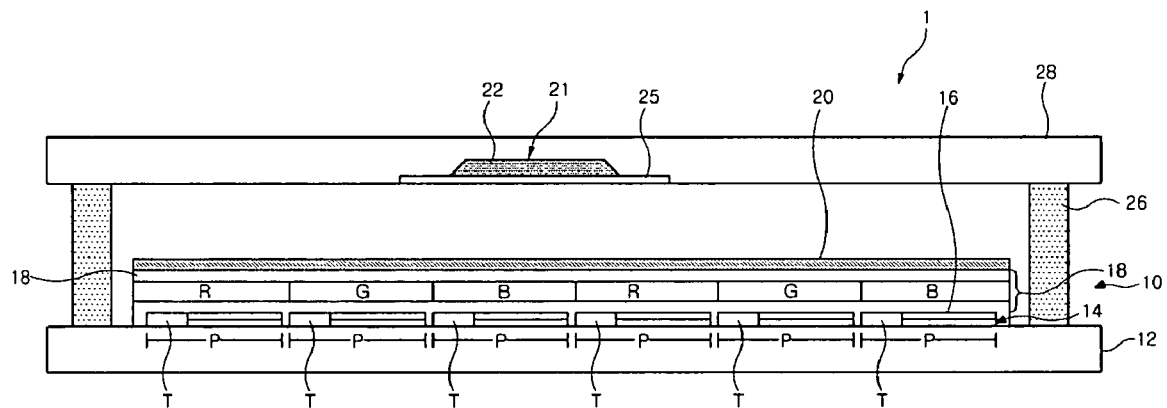
FIG. 1 is a cross-sectional view of an organic ELD according to the related art.
Figure 2:
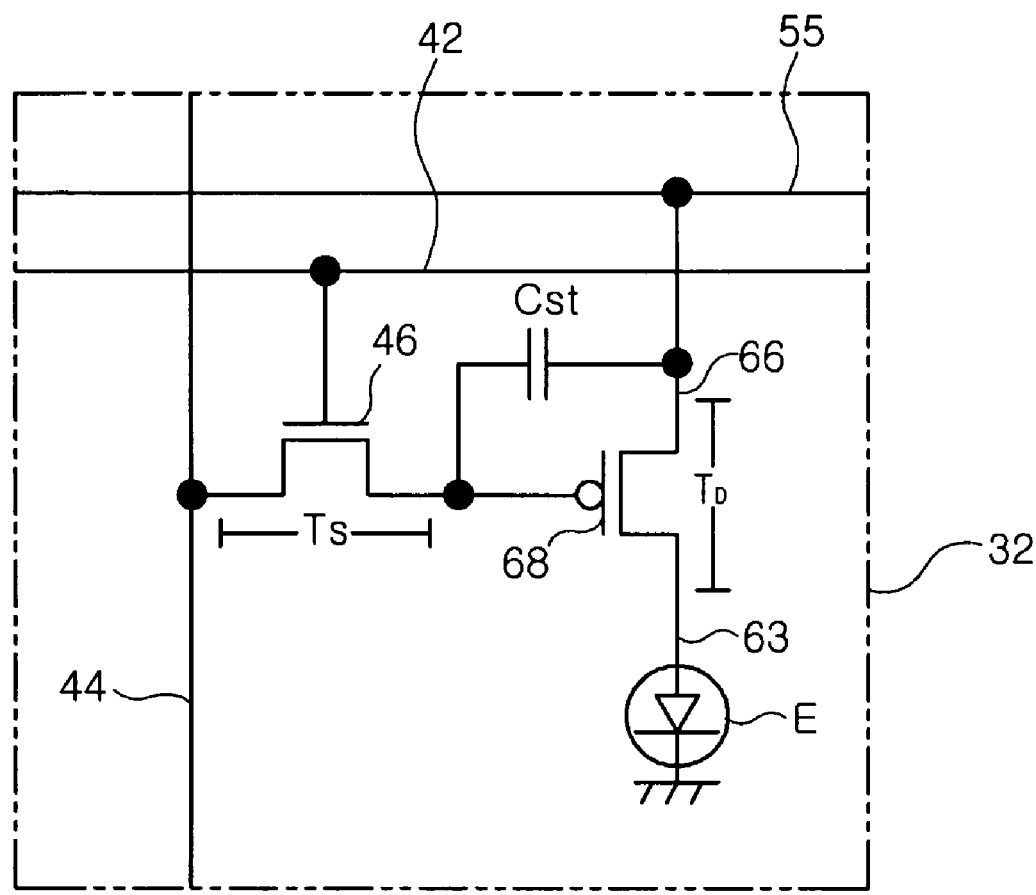
FIG. 2 is an equivalent circuit diagram of an organic ELD according to the related art.
Figure 3:
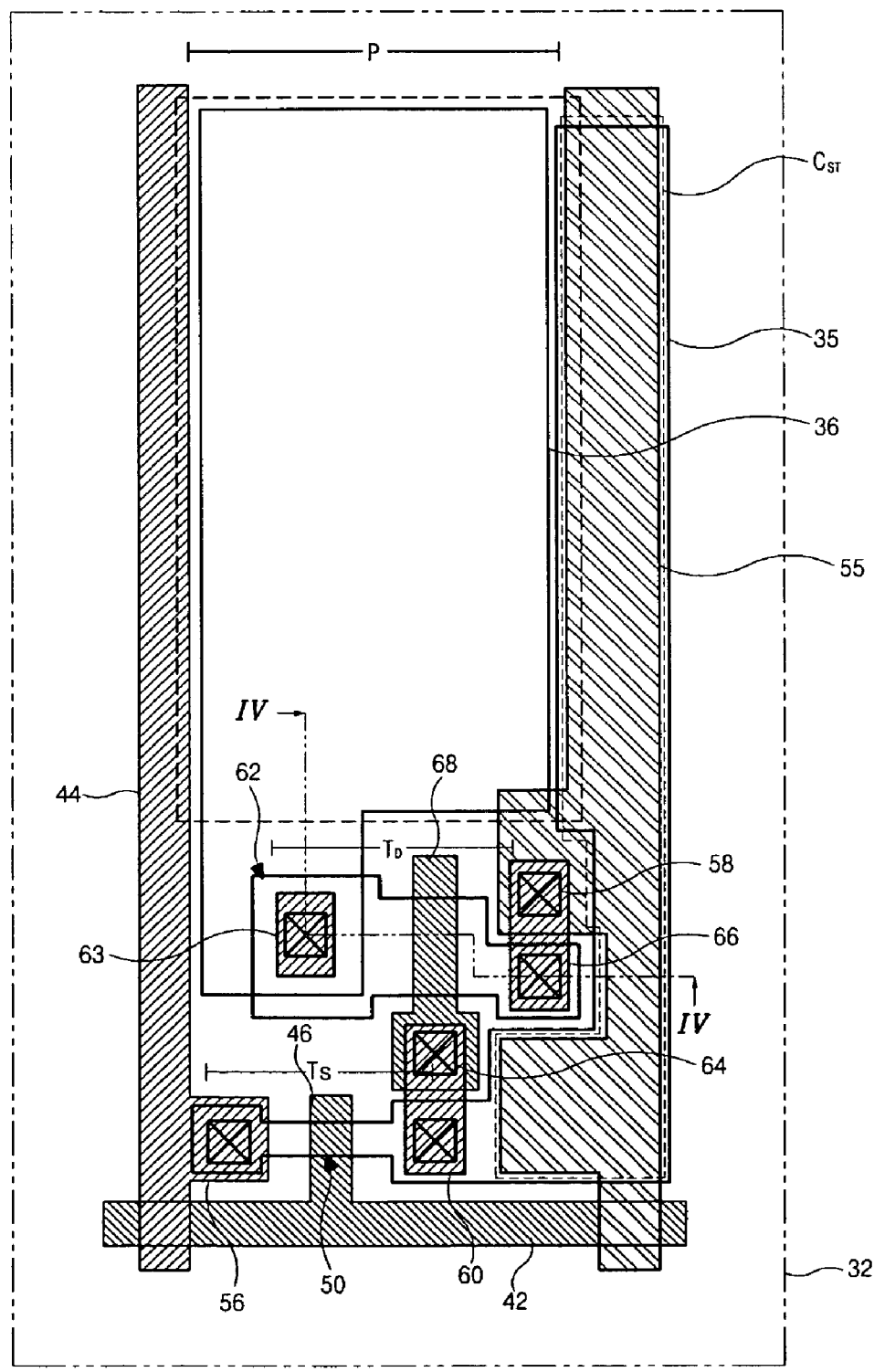
FIG. 3 is a plan view of an organic ELD in one pixel region according to the related art.
Figure 4:
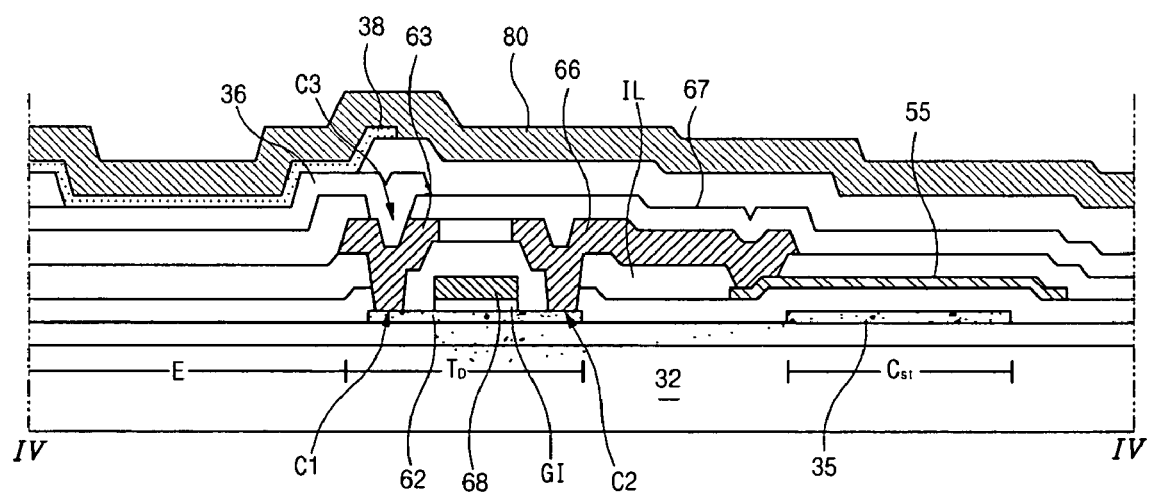
FIG. 4 is a cross-sectional view of an organic ELD along line "IV-IV" in FIG. 3.
Figure 5:
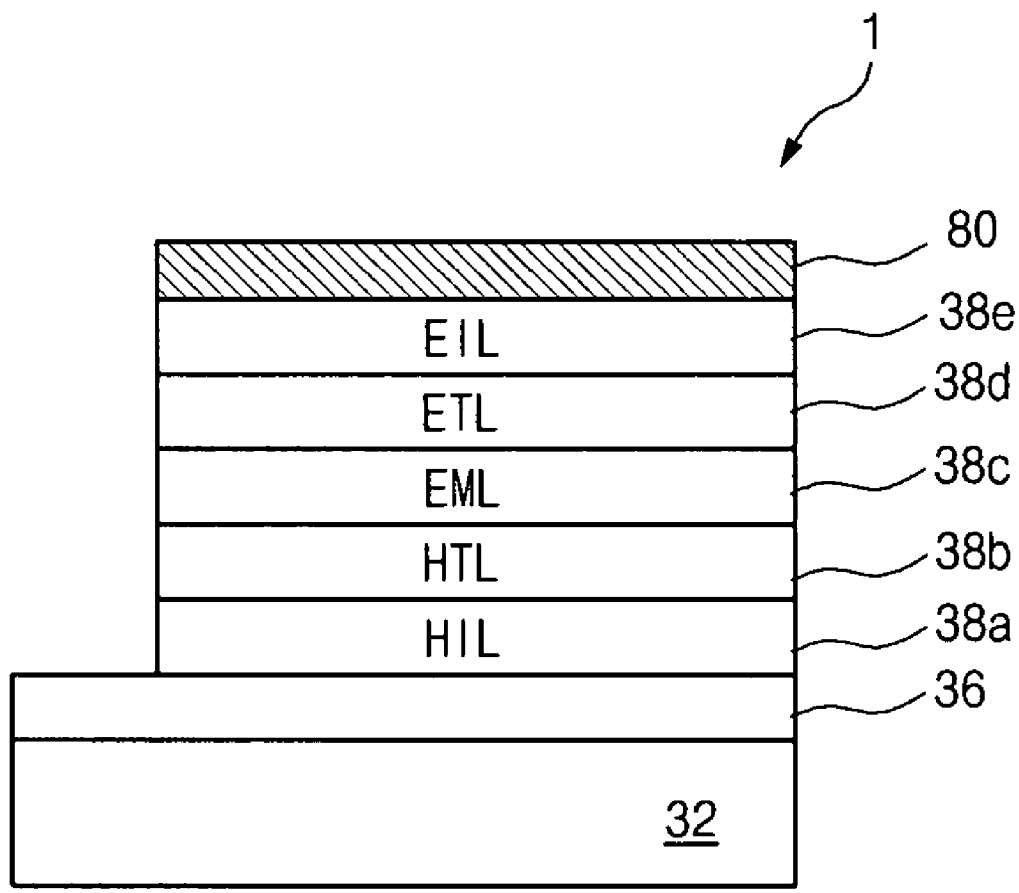
FIG. 5 is a cross-sectional view of an emission region of an organic ELD according to the related art.
Figure 6:
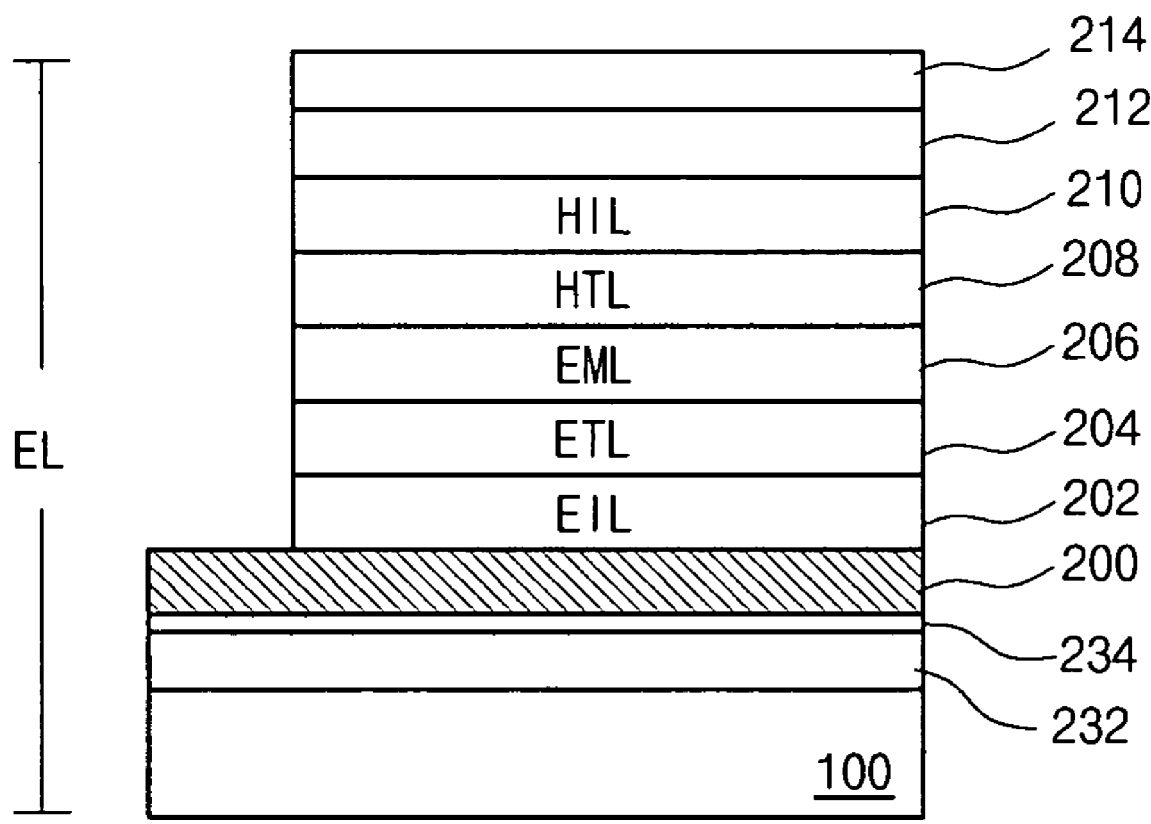
FIG. 6 is a cross-sectional view of an organic ELD according to an embodiment of the invention.

FIG. 6 is a cross-sectional view of an organic ELD according to an embodiment of the invention. As shown in FIG. 6, an organic ELD "EL" includes a cathode 200 connected to the array element (not shown) on a substrate 100, an electron injection layer 202 on the cathode 200, an electron transport layer 204 on the electron injection layer 202, an emitting layer 206 on the electron transport layer 204, a hole transport layer 208 on the emitting layer 206, a hole injection layer 210 on the hole transport layer 208, and an anode 214 over the hole injection layer 210. The anode 214 can be made of a transparent conductive material, such as indium tin oxide or indium zinc oxide.

A buffer layer 212 is disposed between the hole injection layer 210 and the anode 214 to prevent damage to the hole injection layer 210 during deposition of the anode 214 by sputtering. The buffer layer 212 can be one of an organic monomolecular material and an oxide, wherein the organic monomolecular material has a crystallinity and the oxide includes vanadium pentoxide ($V_2O_5$). For example, the organic monomolecular material can be copper phthalocyanine (CuPc), which can be a thin thickness while maintaining a low threshold voltage and high mobility.

Because the anode 214 of the transparent conductive material is disposed at the top position of the layers of organic ELD above the array element (not shown) on the substrate 100, the organic ELD is a top emission type organic ELD. The aperture regions of the top emission organic ELD are improved since light is not blocked by array elements. Further, the driving element of the array elements for a top emission type organic ELD can be an N-type thin film transistor, which is connected to the cathode 200. The semiconductor layer of the N-type thin film transistor can be made of amorphous silicon, thereby reducing the number of processes and production cost. Furthermore, to prevent the cathode from disconnecting from the driving element and to provide a flat surface for the cathode, an overcoat layer 232 and a contact layer 234 are sequentially formed between the driving element and the cathode 200. The contact layer 234 may be a metallic layer or an insulating layer.

Figure 7:
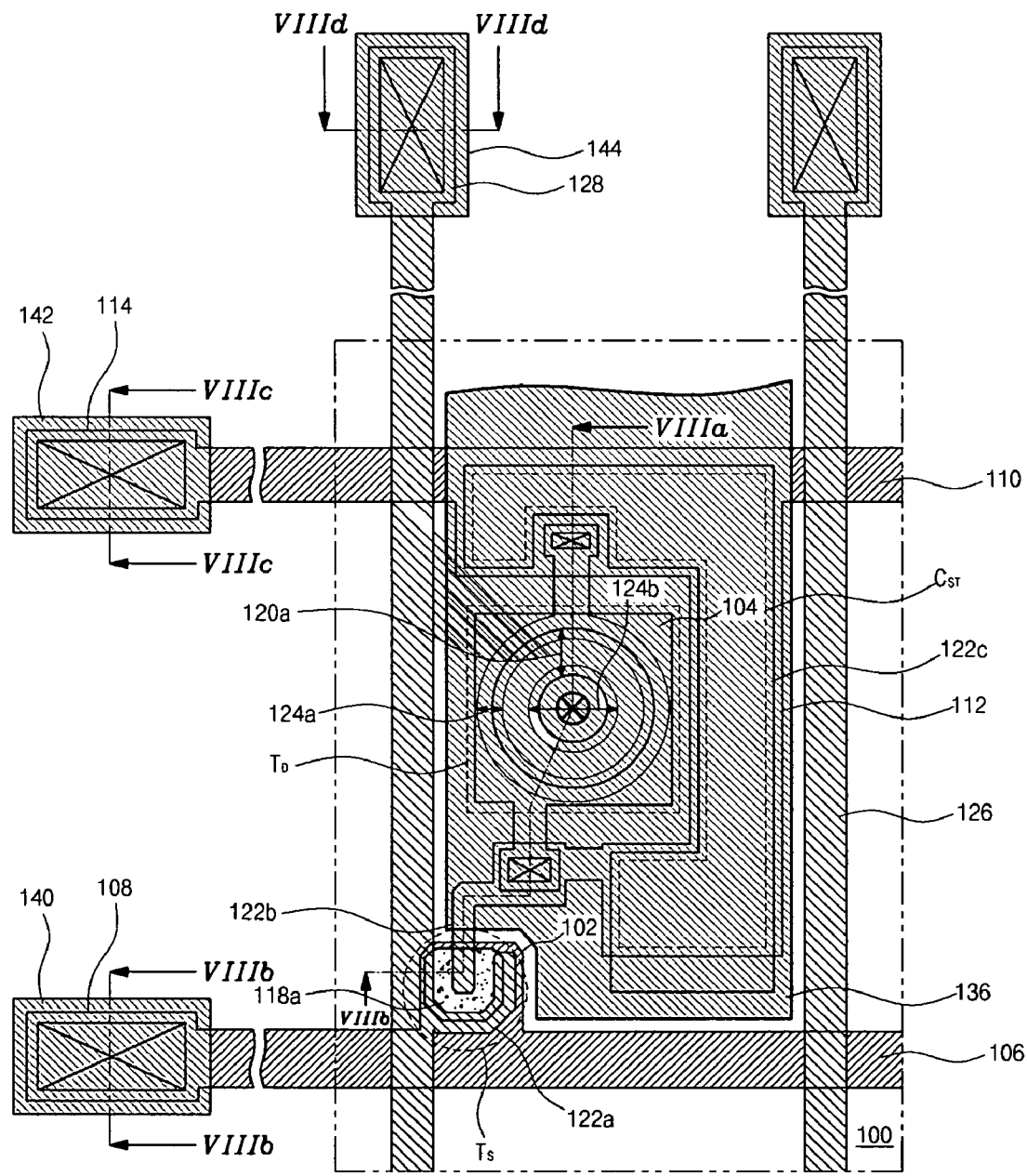
FIG. 7 is a plan view of an array substrate of an organic ELD according to an embodiment of the invention.
Figure 8A:
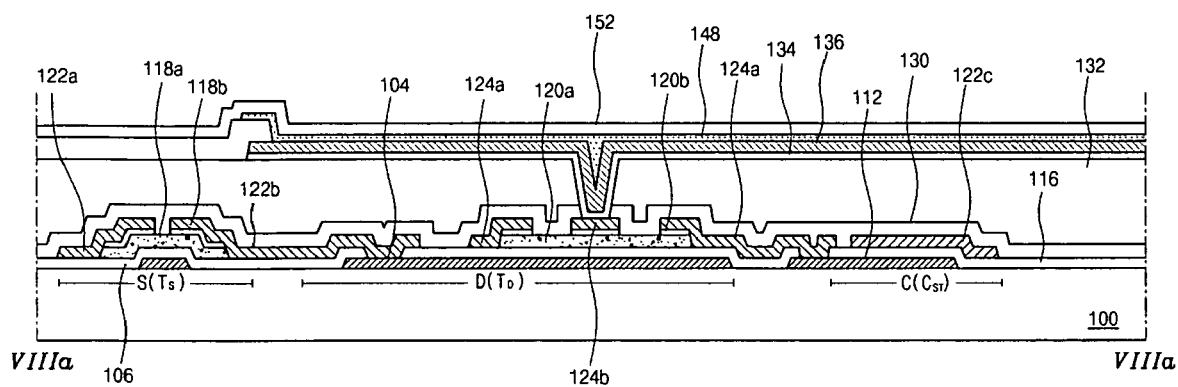
FIGS. 8A, 8B, 8C and 8D are cross-sectional views of an organic ELD along lines "VIIIa-VIIIa," "VIIIb-VIIIb," "VIIIc-VIIIc," and "VIIId-VIIId" of FIG. 7, respectively.
Figure 8B:
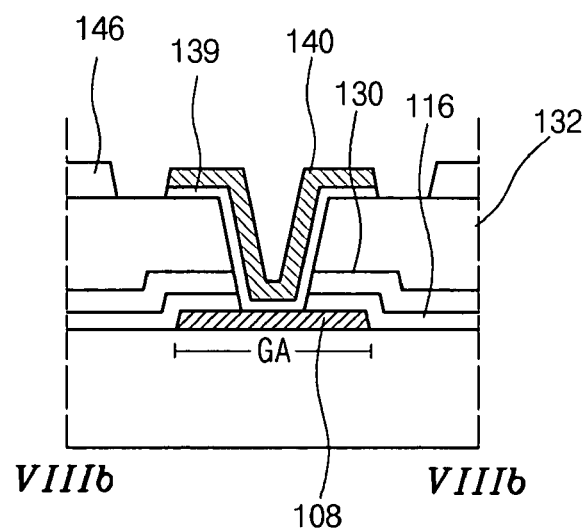
Figure 8C:
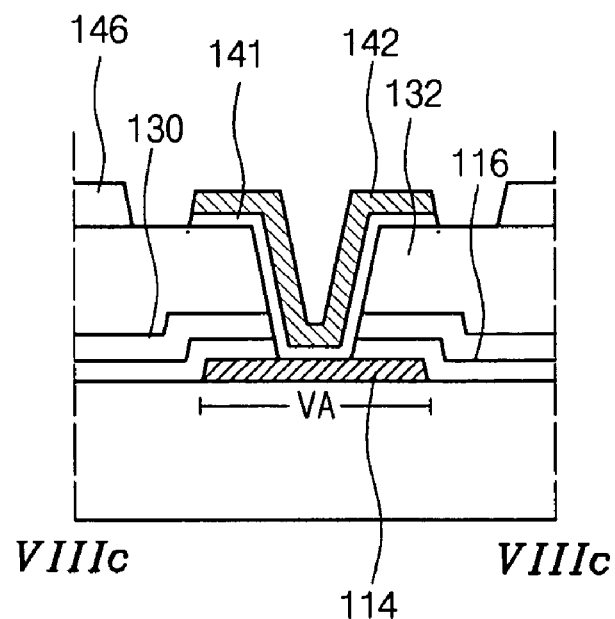
Figure 8D:
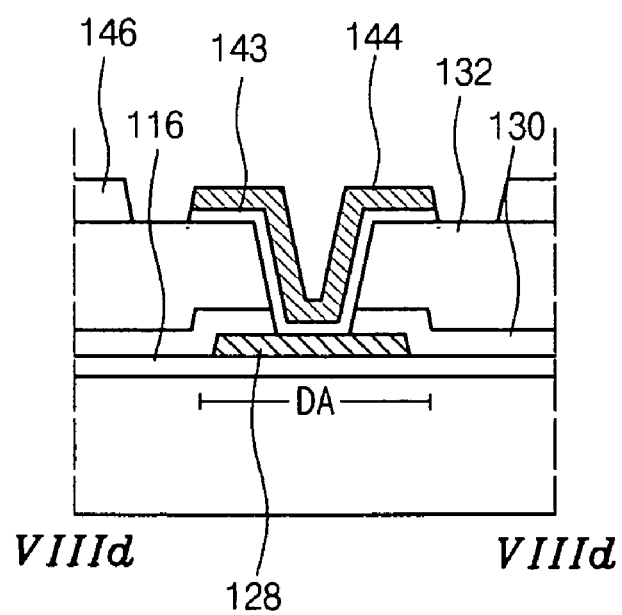
Figure 9A:
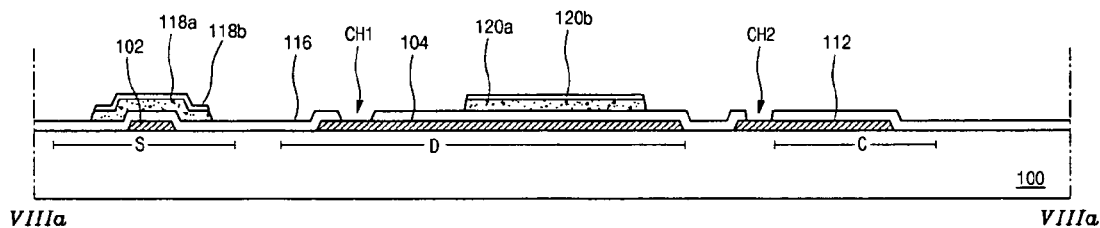
FIGS. 9A to 9E are cross-sectional views in accordance with a fabricating process of an organic ELD along line "VIIIa-VIIIa" of FIG. 7.
Figure 9B:
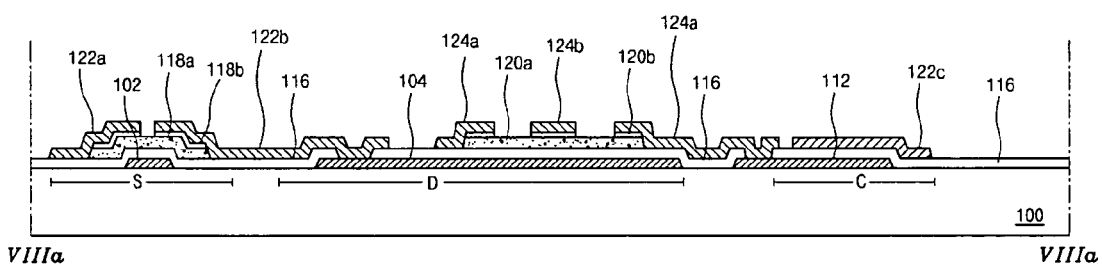
Figure 9C:
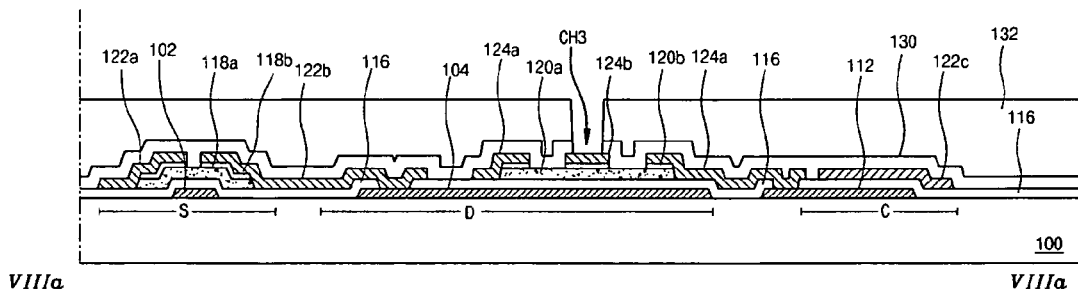
Figure 9D:
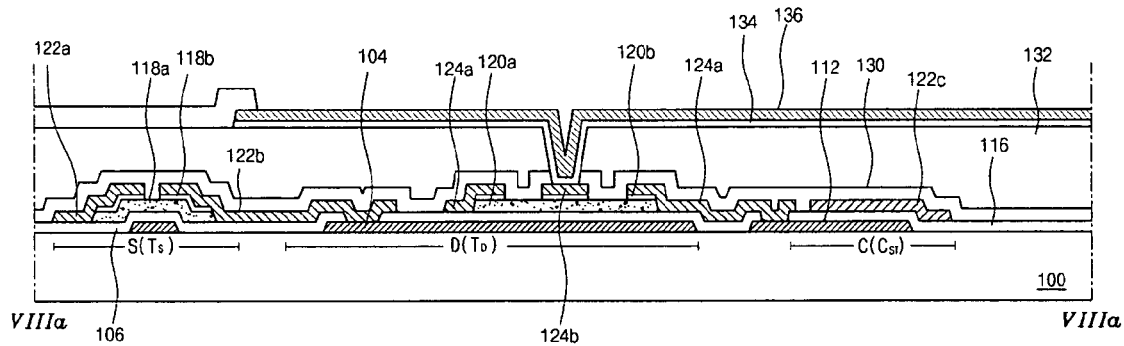
Figure 9E:
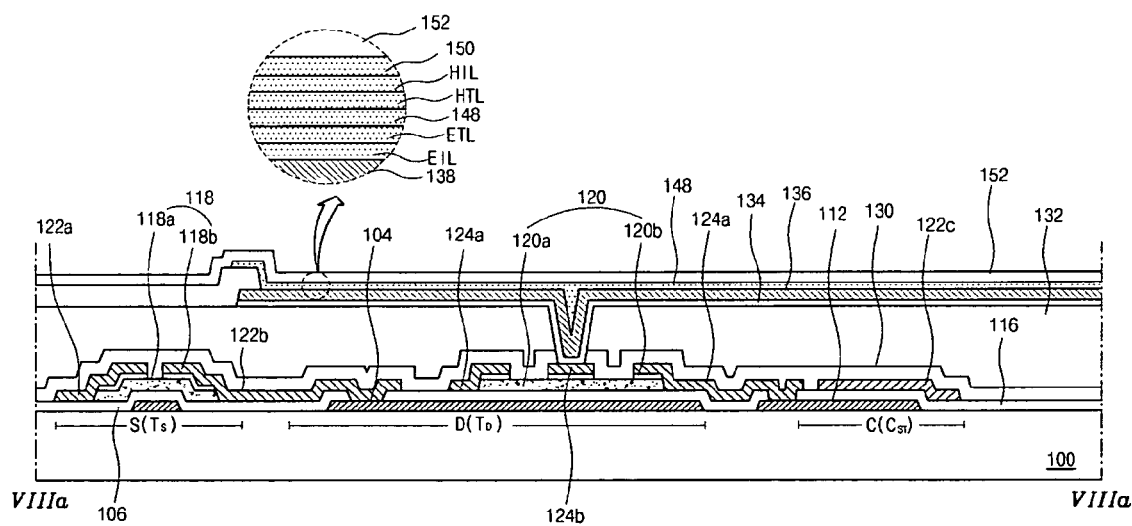
Figure 10A:
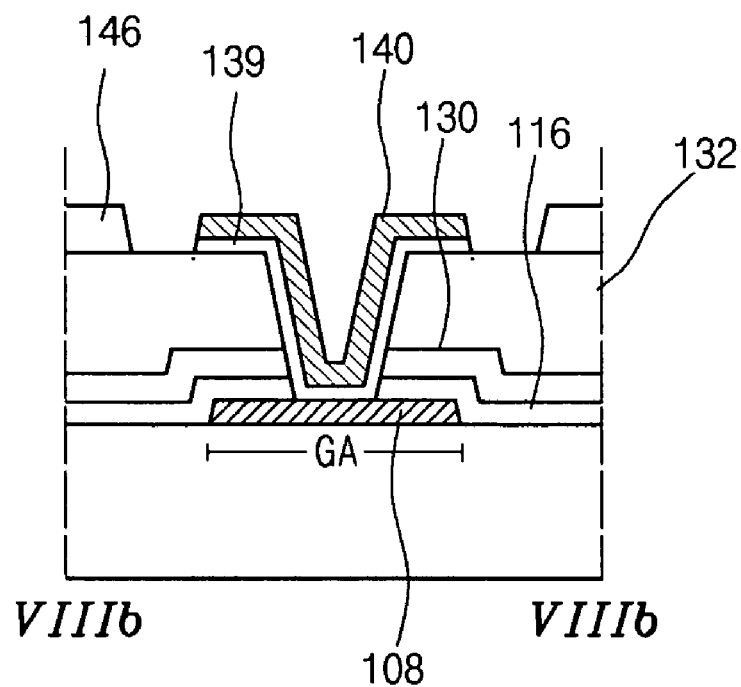
FIGS. 10A to 10E are cross-sectional views in accordance with a fabricating process of an organic ELD along line "VIIIb-VIIIb" of FIG. 7.
Figure 10B:
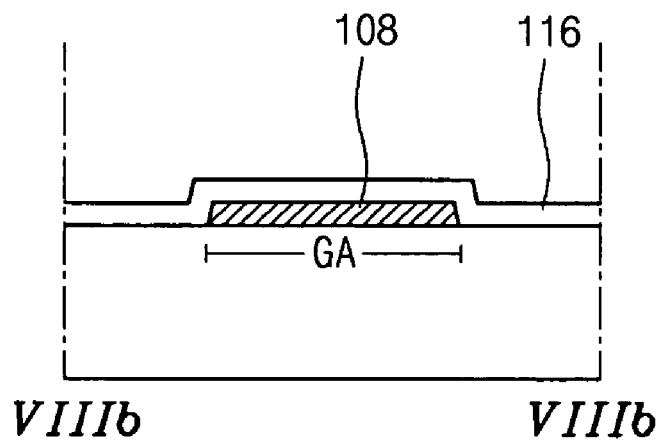
Figure 10C:
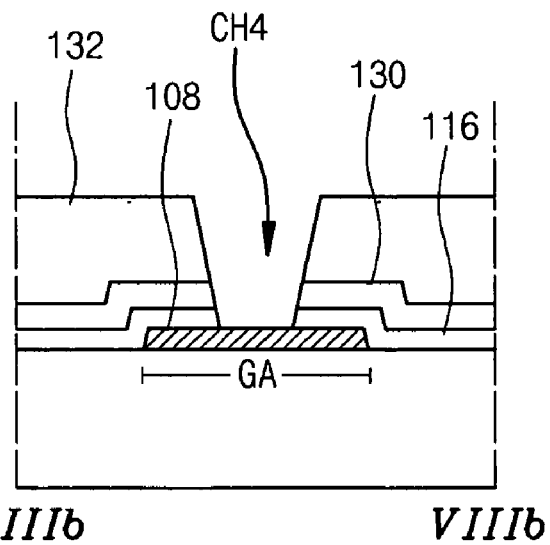
Figure 10D:
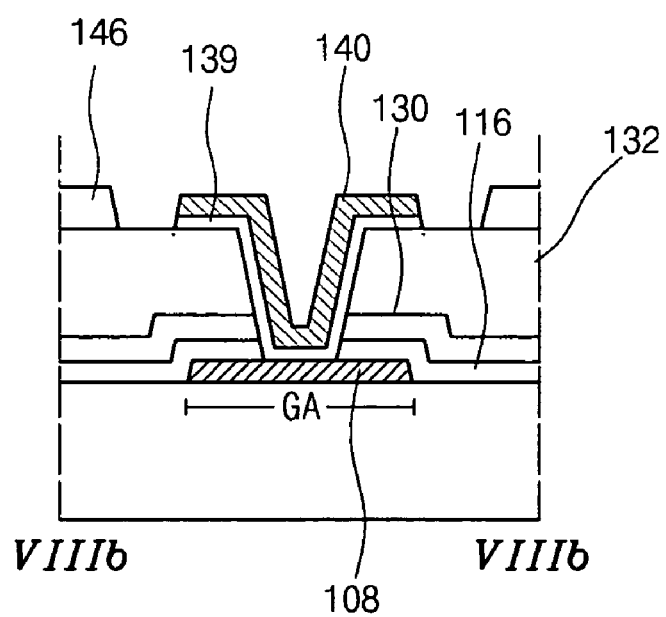
Figure 10E:
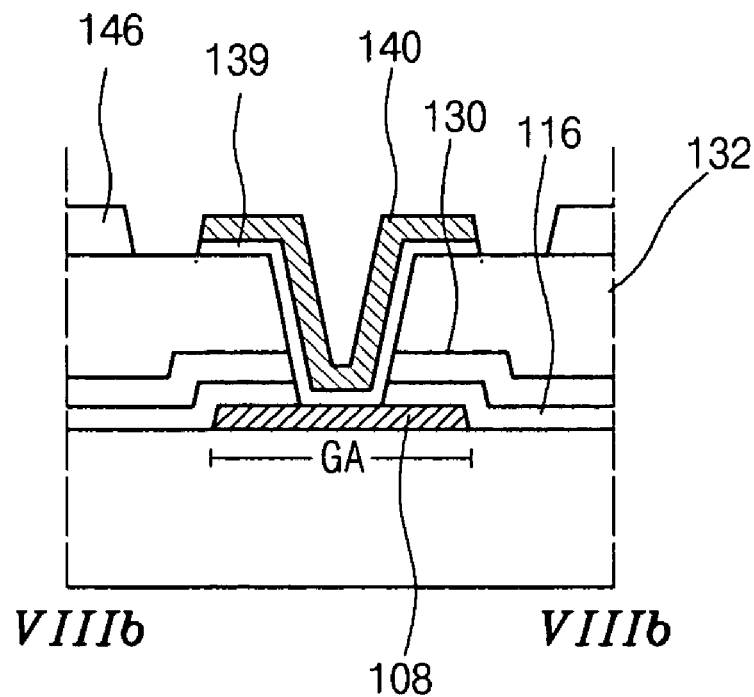
Figure 11A:
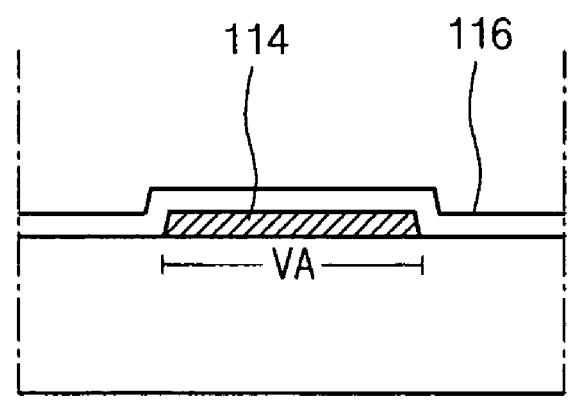
FIGS. 11A to 11E are cross-sectional views in accordance with a fabricating process of an organic ELD along line "VIIIc-VIIIc" of FIG. 7.
Figure 11B:
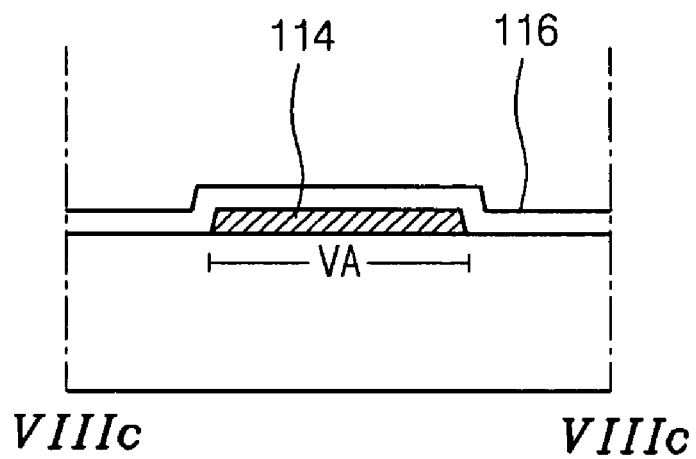
Figure 11C:
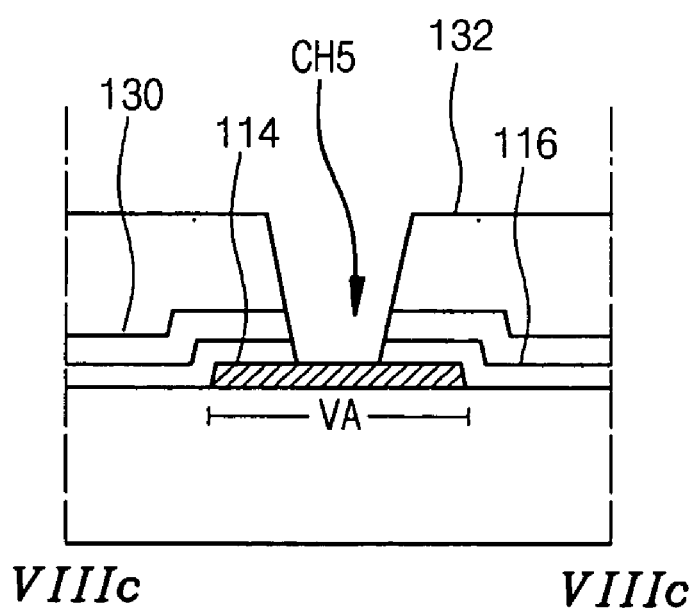
Figure 11D:
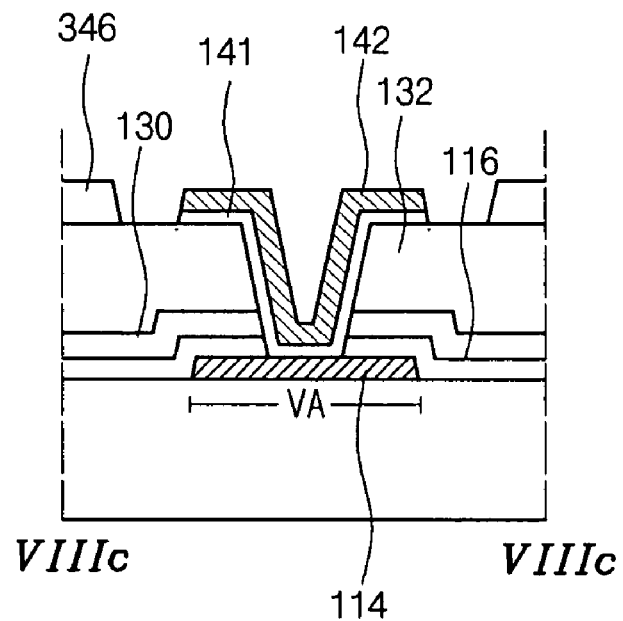
Figure 11E:
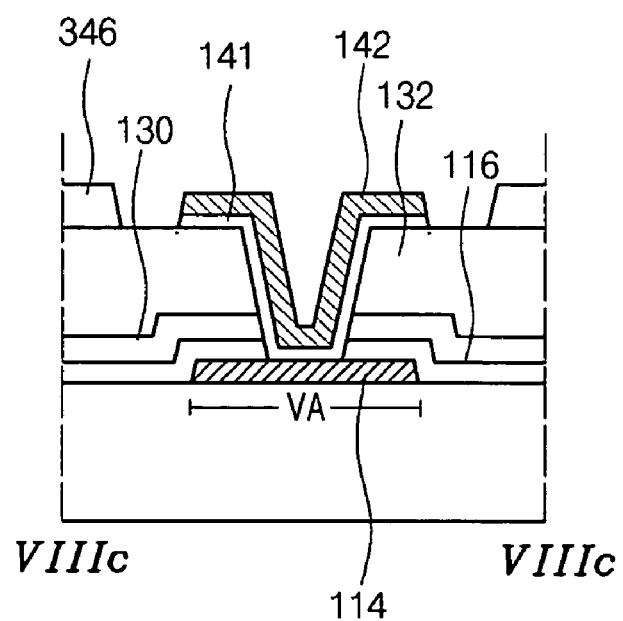
Figure 12A:
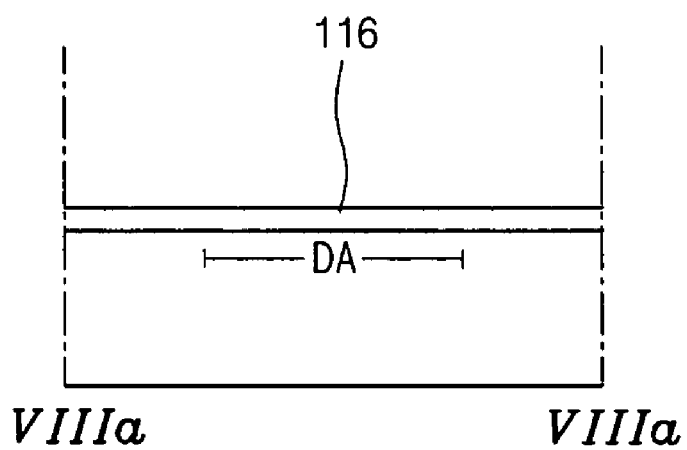
FIGS. 12A to 12E are cross-sectional views in accordance with a fabricating process of an organic ELD along line "VIIId-VIIId" of FIG. 7.
Figure 12B:
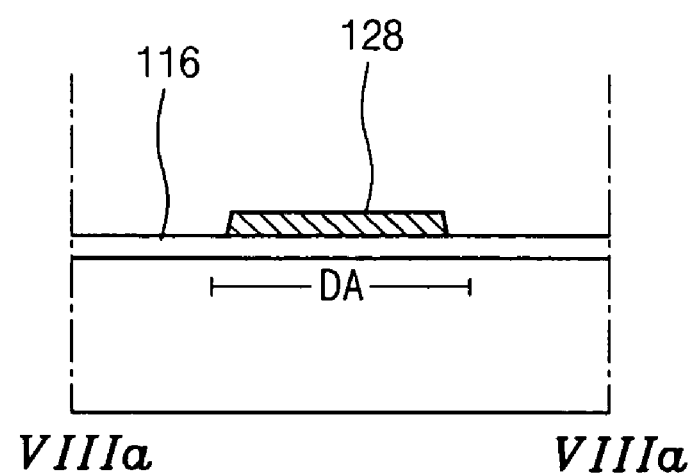
Figure 12C:
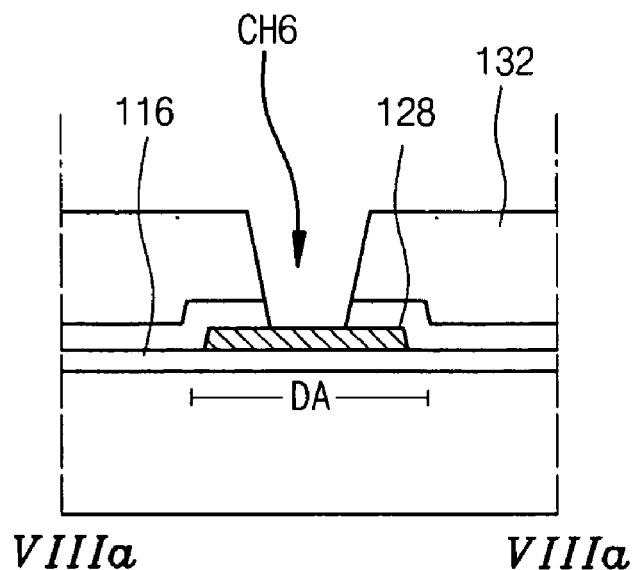
Figure 12D:
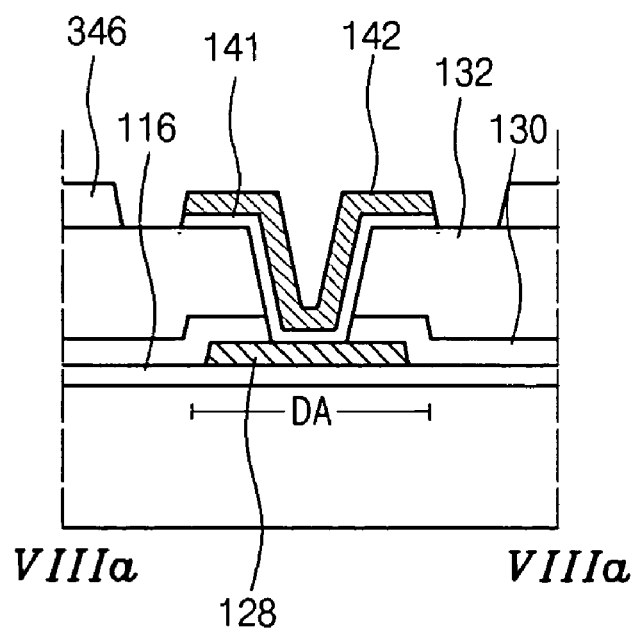
Figure 12E:
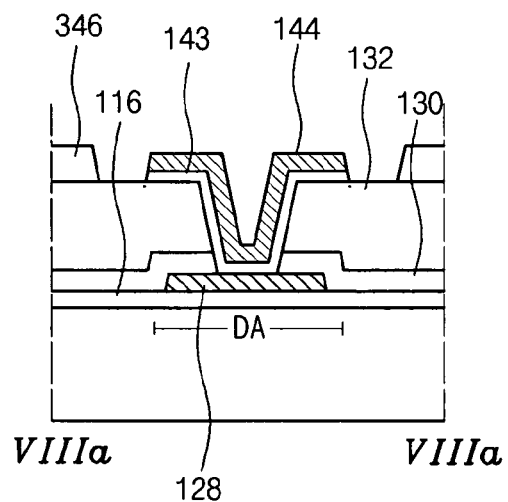
Figure 13A:
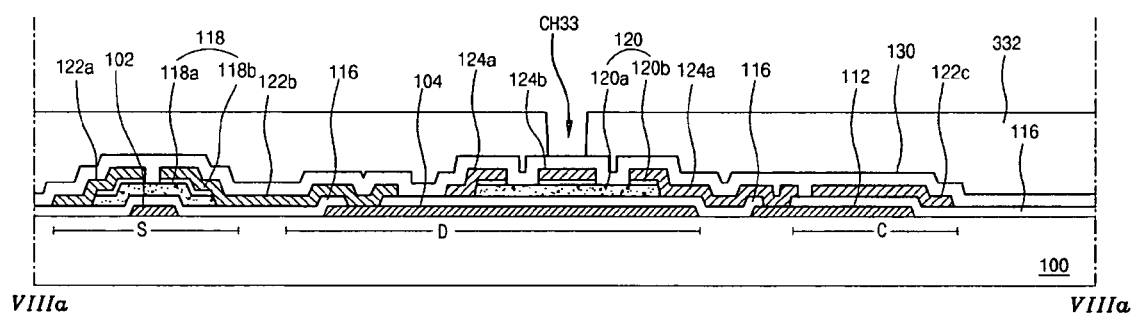
FIGS. 13A to 13E are cross-sectional views in accordance with a fabricating process of an organic ELD along line "VIIIa-VIIIa" of FIG. 7.
Figure 13B:
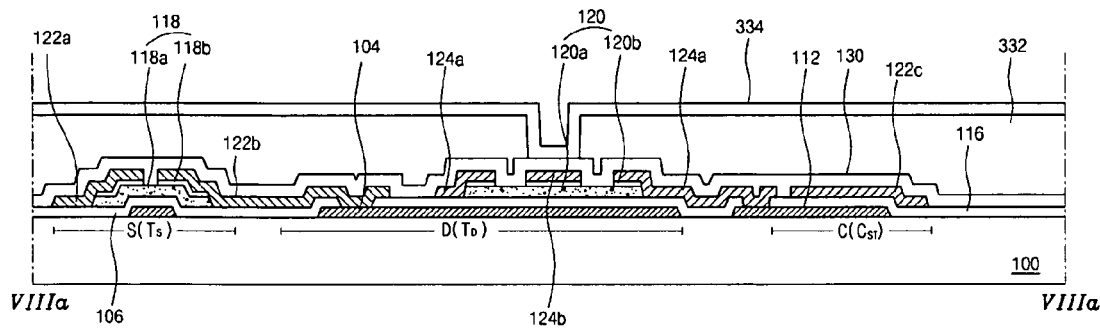
Figure 13C:
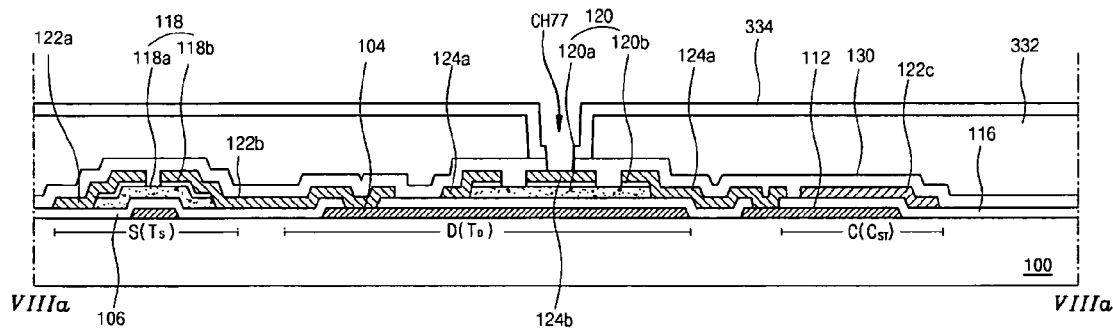
Figure 13D:
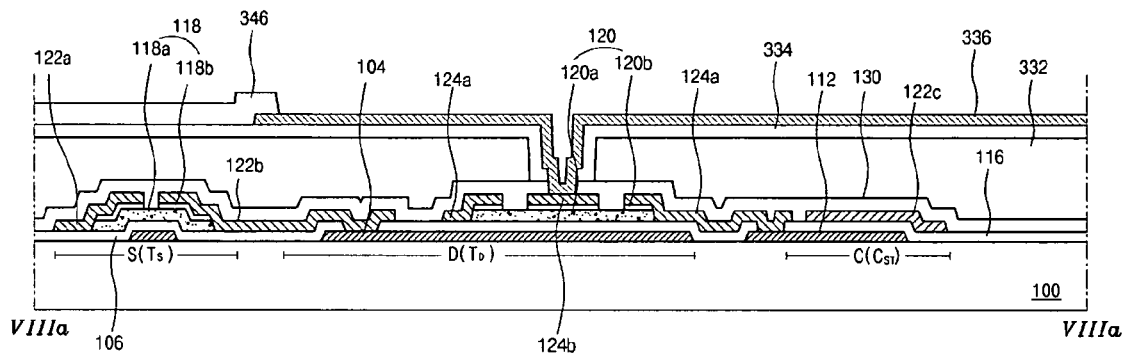
Figure 13E:
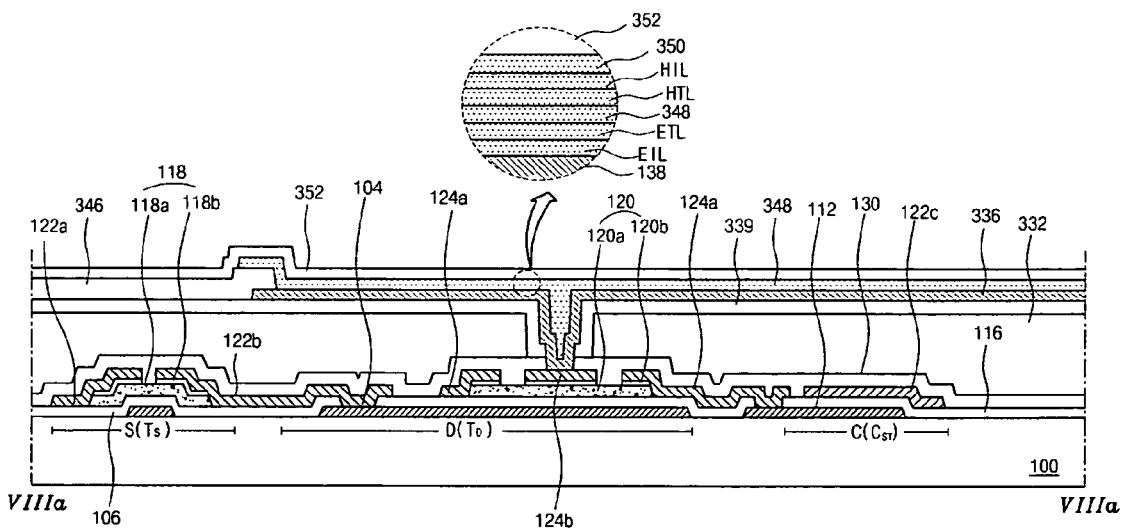
Figure 14A:
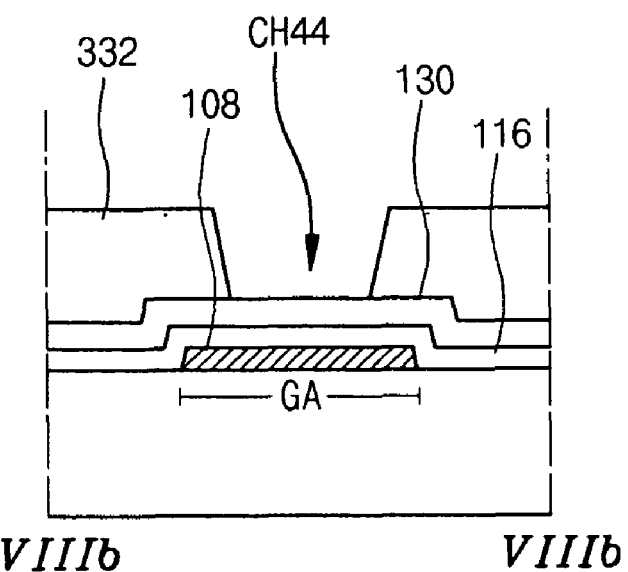
FIGS. 14A to 14E are cross-sectional views in accordance with a fabricating process of an organic ELD along line "VIIIb-VIIIb" of FIG. 7.
Figure 14B:
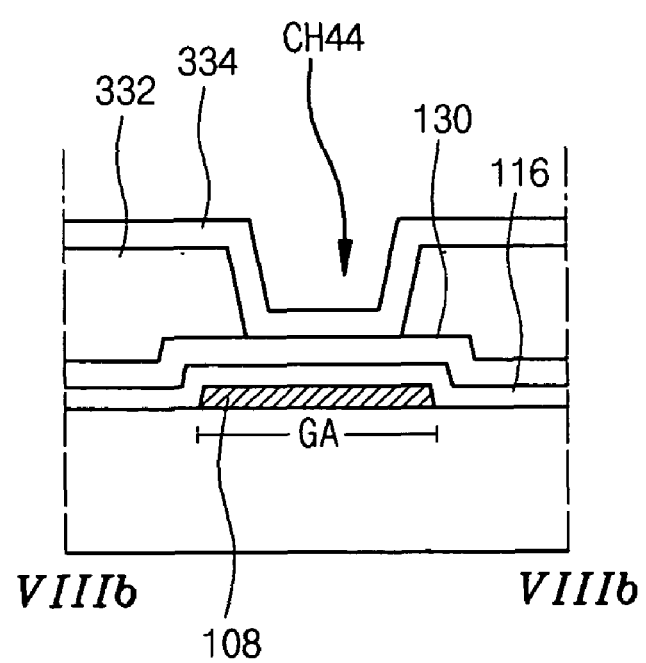
Figure 14C:
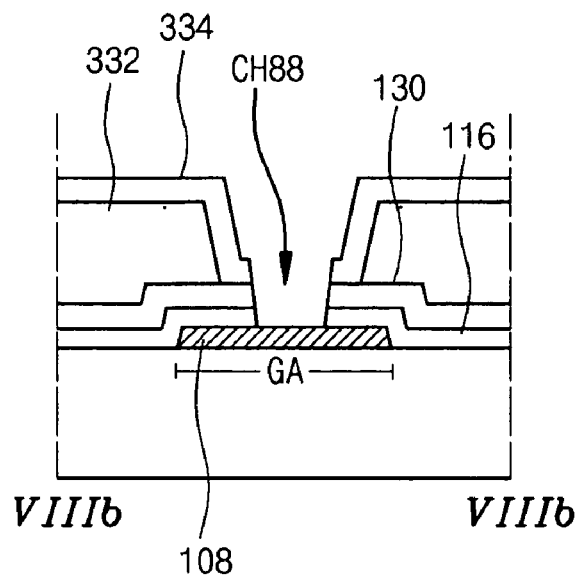
Figure 14D:
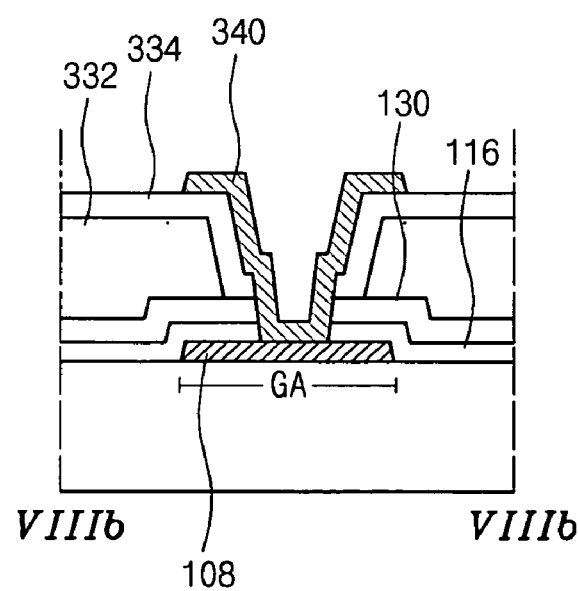
Figure 14E:
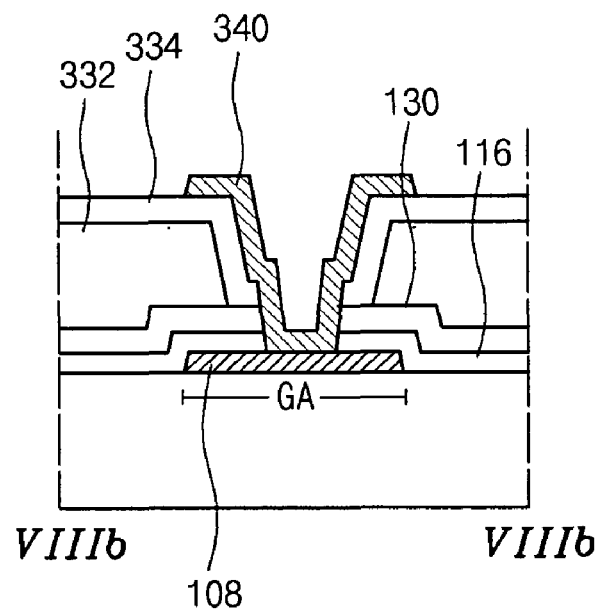
Figure 15A:
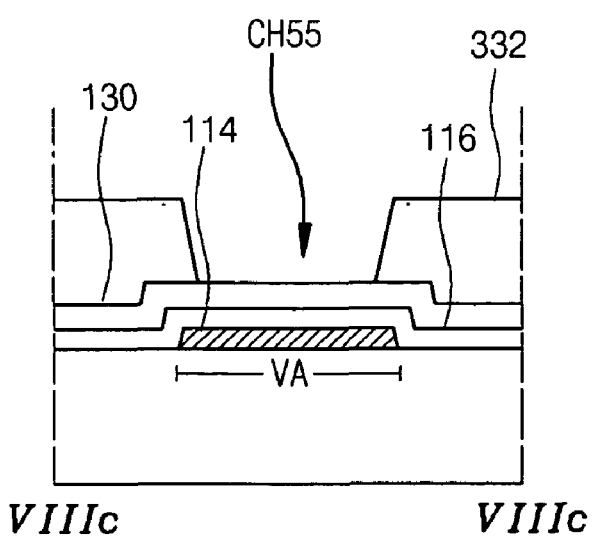
FIGS. 15A to 15E are cross-sectional views in accordance with a fabricating process of an organic ELD along line "VIIIc-VIIIc" of FIG. 7.
Figure 15B:
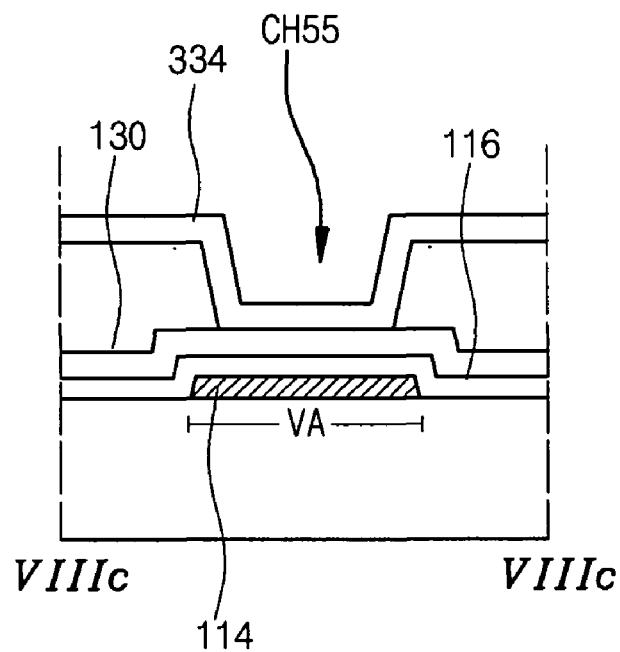
Figure 15C:
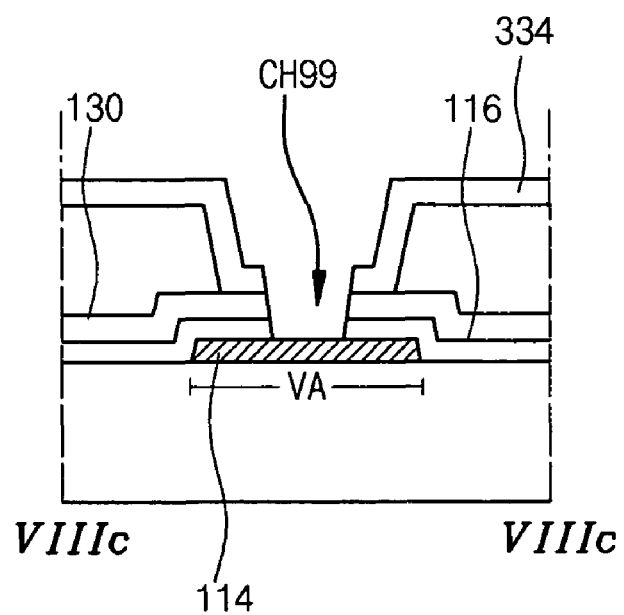
Figure 15D:
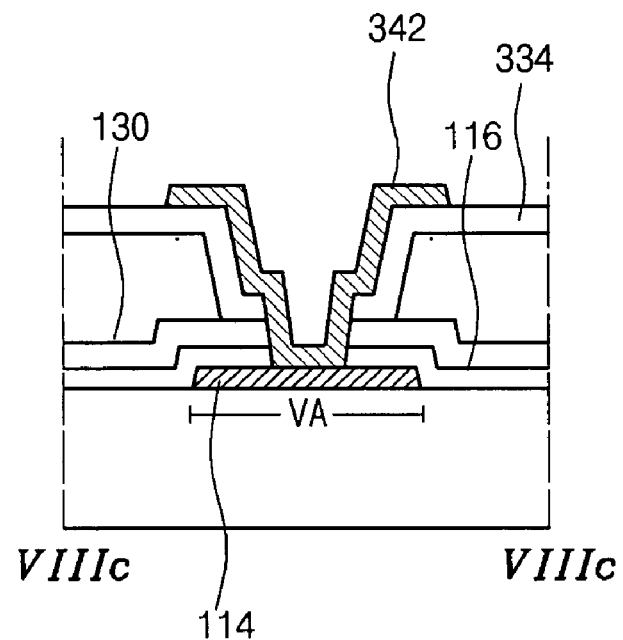
Figure 15E:
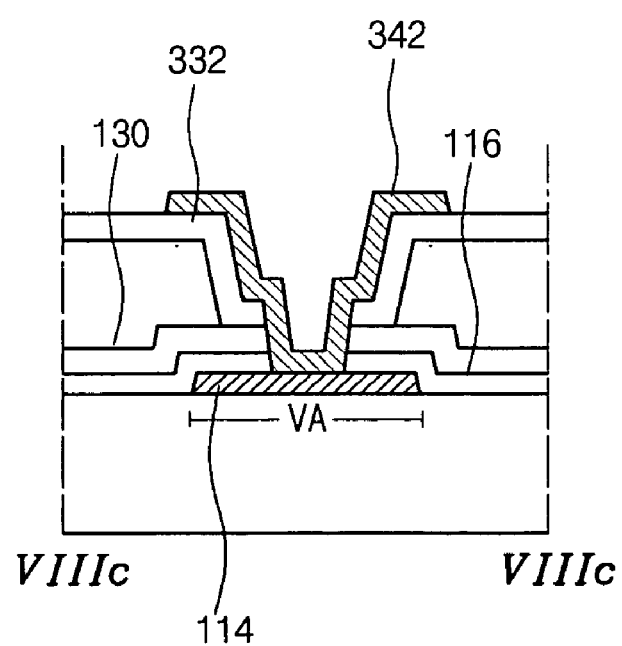
Figure 16A:
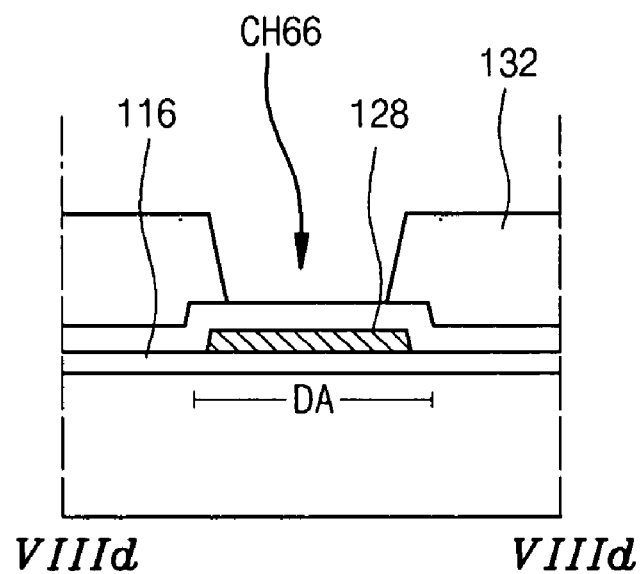
FIGS. 16A to 16E are cross-sectional views in accordance with a fabricating process of an organic ELD along line "VIIId-VIIId" of FIG. 7.
Figure 16B:
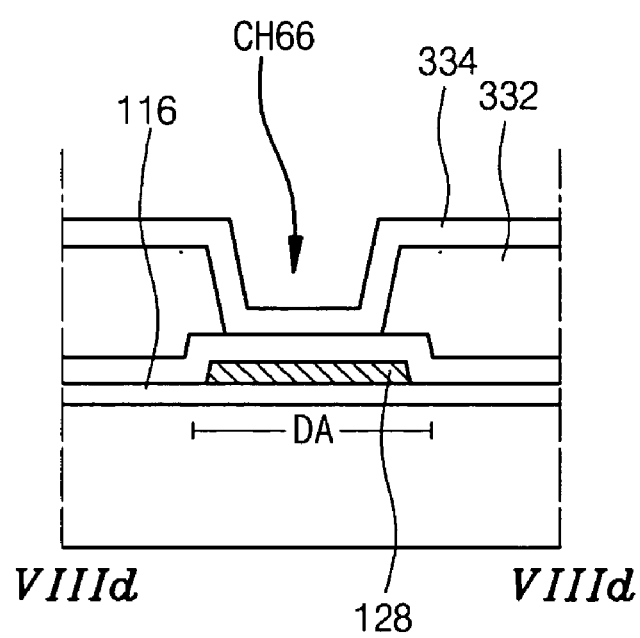
Figure 16C:
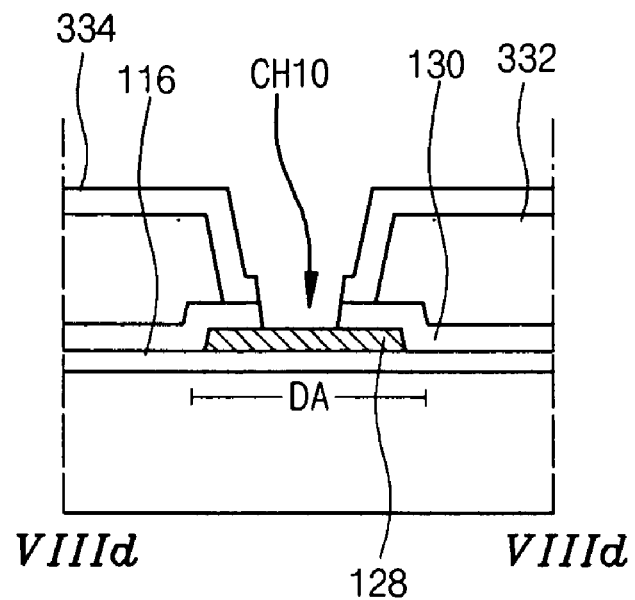
Figure 16D:
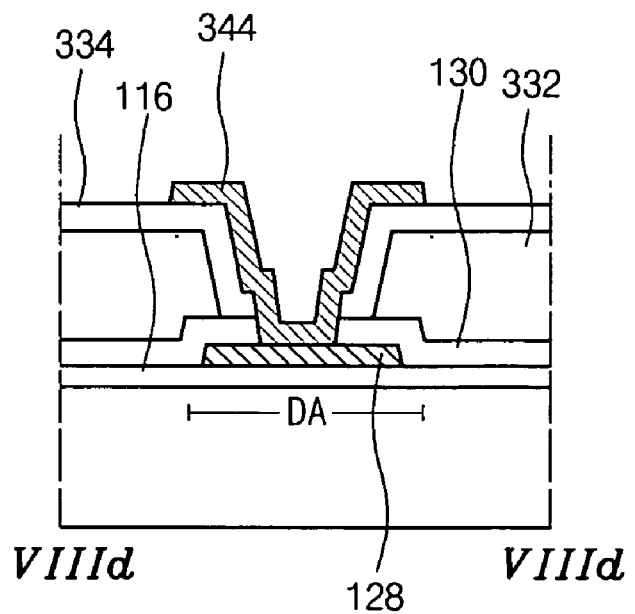
Figure 16E:
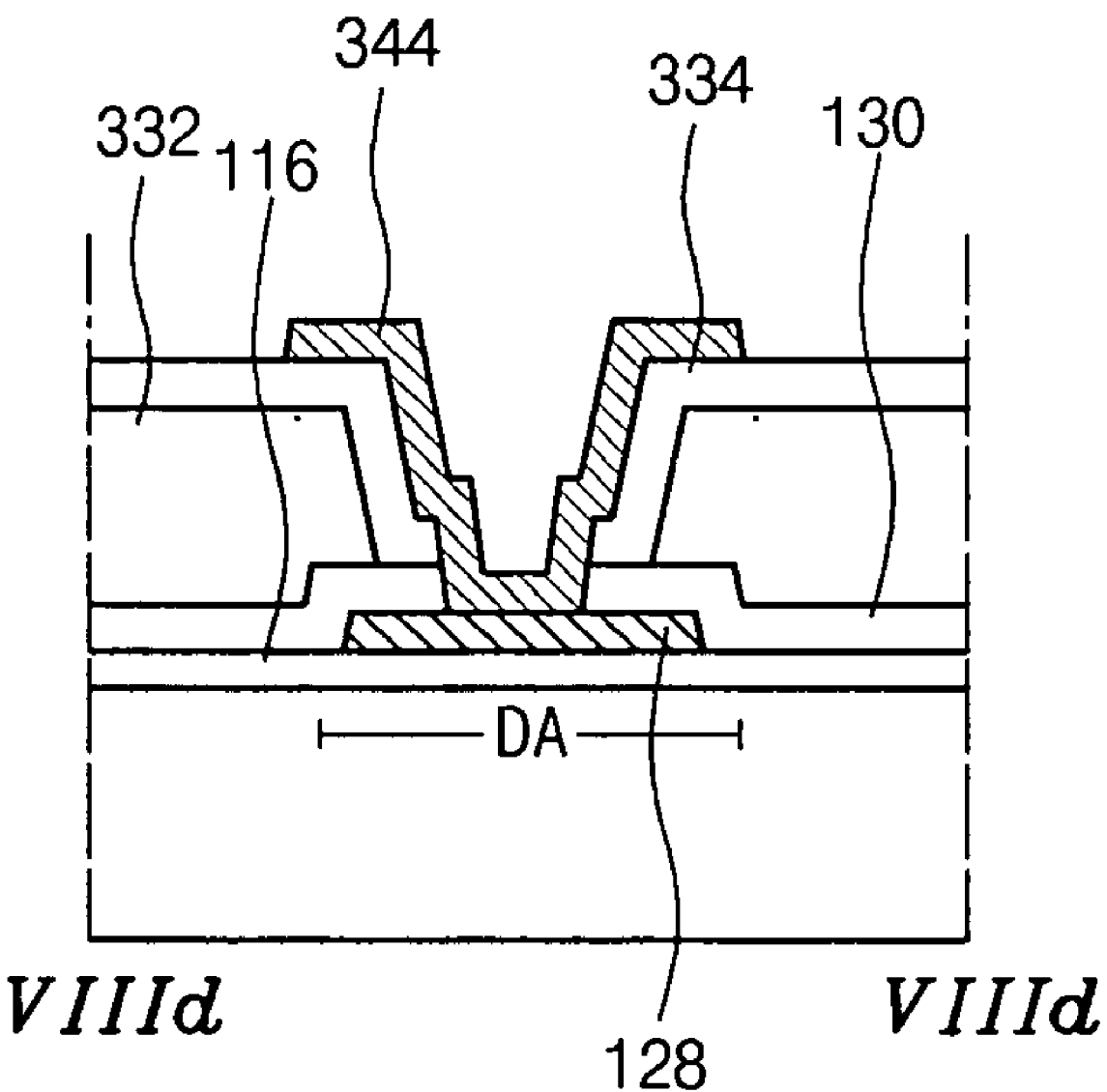

FIG. 7 is a plan view of an array substrate of an organic ELD according to an embodiment of the invention. As shown in FIG. 7, a switching element "Ts" and a driving element "TD" connected the switching element "Ts" are formed on a substrate 100 in a pixel region "P." The switching element "Ts" can be an N-type thin film transistor including a first gate electrode 102, a first semiconductor layer 118a, a first source electrode 122a, a first drain electrode 122b. In addition, the driving element "TD" can be an N-type thin film transistor including a second gate electrode 104, a second semiconductor layer 120a, a second source electrode 124a, a second drain electrode 124b. More specifically, the driving element "TD" is connected to the switching element "Ts" by connecting the second gate electrode 104 to the first drain electrode 122b.

A gate line 106 is formed on the substrate 100 along a first direction and is connected to the first gate electrode 102 to apply a scanning signal to the first gate electrode 102. A data line 126 formed in a second direction to cross the gate line 106 so as to define the pixel region "P." The data line 126 is connected to the first source electrode 122a to apply a data signal to the first source electrode 122a. In addition, a power line 110 extends in the first direction parallel to and spaced apart from the gate line 106.

A gate pad 108, a data pad 128 and a power pad 114 are formed at end portions of the gate line 106, the data line 126 and the power line 110, respectively. Further, a gate pad terminal 140, a data pad terminal 144 and a power pad terminal 142 are connected to the gate pad 108, the data pad 128 and the power pad 114, respectively. For example, the gate pad terminal 138, the data pad terminal 142 and the power pad terminal 140 can be made of a transparent conductive material, such as indium tin oxide (ITO) or indium zinc oxide (IZO).

A storage capacitor "Cst" includes a first storage electrode 112 extending from the power line 110, a second storage electrode 122c extending from the first drain electrode 122b, and an insulating layer (not shown) between the first storage electrode 112 and the second storage electrode 122c. In other words, the first storage electrode 112, the insulating layer and the second storage electrode 122c are sequentially layered to form the storage capacitor "Cst."

A cathode 138 is formed as a first electrode connected to the second drain electrode 124b. Although not shown, an emitting layer (not shown) is formed on the cathode 138 and an anode (not shown) is formed as a second electrode on the emitting layer. The first and second semiconductor layers 118a and 120a in the respective switching element "Ts" and the driving element "TD" can be made of amorphous silicon.

The first source electrode 122a can be shaped like a "U" and the first drain electrode 122b can be shaped like a bar within the first source electrode 122a. The second source electrode 122a can be shaped like a ring while the second drain electrode 124b can be circular shaped within the second source electrode 124a. Due to the channel shapes of the switching element "Ts" and the driving element "TD," the channel length (not shown) is reduced and the channel width (not shown) is increased, thereby maximizing the channel width and minimizing thermallization of the organic ELD.

FIGS. 8A, 8B, 8C and 8D are cross-sectional views of an organic ELD along lines "VIIIa-VIIIa," "VIIIb-VIIIb," "VIIIc-VIIIc," and "VIIId-VIIId" of FIG. 7, respectively. As shown in FIGS. 8A, 8B, 8C and 8D, a pixel region "P," a switching region "S," a driving region "D" and a storage region "C," a gate region "GA," a power region "VA" parallel to the gate region "GA," and a data region "DA" perpendicular to the gate region "GA" and the power region "VA" are defined on a substrate 100.

A switching element "Ts" and a driving element "TD" connected to the switching element "Ts" are formed in the switching region "S" and the driving region "D," respectively. The switching element "Ts" includes a first gate electrode 102, a first semiconductor layer 118a, a first source electrode 122a, and a first drain electrode 122b. A driving element "TD" includes a second gate electrode 104, a second semiconductor layer 120a, a second source electrode 124a, and a second drain electrode 124b. A gate line 106 (of FIG. 7) is formed along a first direction on the substrate 100. A power line 110 (of FIG. 7) is formed along a first direction on the substrate 100 parallel to and spaced apart from the gate line 106. A data line 126 (of FIG. 7) is formed in a second direction crossing the gate line 106 to define a pixel region "P."

In the storage region "C," a first storage electrode 112 extends from the power line 110 and a second storage electrode 112 extends from the first drain electrode 122b with a gate insulating layer 116 disposed between first and second storage electrodes 110 and 112.

In the pixel region "P," a contact layer 134 that includes a metallic material is provided on the second drain electrode 124b and a cathode 136 is formed on the contact layer 134. Further, an emitting layer 148 is formed on the cathode 136, and a buffer layer 150 is formed on the emitting layer 148. Although not shown, the organic ELD may further include multi-layers between the cathode 136 and the emitting layer 148 and between the emitting layer 148 and the anode 152. The first active layer 118a and the first ohmic contact layer 118b constitute a first semiconductor layer 118, and the second active layer 120a and the second ohmic contact layer 120b constitute a second semiconductor layer 120.

The first gate electrode 102, the first semiconductor layer 118, the first source electrode 122a, and the first drain electrode 122b constitute a switching element "Ts." In addition, the second gate electrode 104, the second semiconductor layer 120, the second source electrode 124a, and the second drain electrode 124b constitute a driving element "TD." Specifically, the second gate electrode 104 is connected to the first drain electrode 122b via a contact hole (not shown) in the gate insulating layer 116, and the second source electrode 124a is connected to the power line 110. A passivation layer 146 is formed on the cathode 136 at a boundary between the pixel regions "P," so that the emitting layer 148 in each pixel region "P" do not contact each other.

A gate pad 108, a data pad 128 and a power pad 114 are formed at end portions of the gate line 106, the data line 126 and the power line 110, respectively. In addition, a gate pad terminal 140, a data pad terminal 144 and a power pad terminal 142 are connected to the gate pad 108, the data pad 128 and the power pad 114, respectively.

When the emitting layer 148 is deposited over the substrate 100, step differences due to the array elements (not show), including the switching element "Ts" and the driving element "TD," may cause shorting between the electrodes, or a dark spot may cause by accelerating thermallization of the emitting layer 148. An overcoat layer 132 is formed before forming the cathode over the substrate 100 to provide a planar surface for prior to depositing the emitting layer 148. Further, a contact layer 134 is formed between the overcoat layer 132 and the cathode 136, thereby preventing peeling of the cathode 138.

FIGS. 9A to 9E are cross-sectional views in accordance with a fabricating process of an organic ELD along line "VIIIa-VIIIa" of FIG. 7. FIGS. 10A to 10E are cross-sectional views in accordance with a fabricating process of an organic ELD along line "VIIIb-VIIIb" of FIG. 7. FIGS. 11A to 11E are cross-sectional views in accordance with a fabricating process of an organic ELD taken along line "VIIIc-VIIIc" of FIG. 7. FIGS. 12A to 12E are cross-sectional views in accordance with a fabricating process of an organic ELD along line "VIIId-VIIId" of FIG. 7.

As shown in FIGS. 9A, 10A, 11A and 12A, a pixel region "P," a switching region "S," a driving region "D," and a storage region "C" are formed on a substrate 100. Further, a gate region "GA" and a data region "DA" define the pixel region "P." Furthermore, a power region "VA" is disposed in a region parallel to the gate region "GA." First and second gate electrodes 102 and 104 are formed by depositing a patterned aluminum (Al) or aluminum alloy, such as aluminum neodymium (AlNd), chromium (Cr), Mo, copper (Cu), and titanium (Ti), in the switching region "S" and the driving region "D," respectively. In the gate region "GA," a gate line 106 (of FIG. 7), which is connected to the first gate electrode 102, is formed on the substrate 100, and a gate pad 108 is formed at end portion of the gate line 106. A power line 110 is formed in the power region "VA," and a power pad 114 is formed at an end portion of the power line 110. A first storage electrode 112 extending from the power line 110 is formed in the storage region "C."

Then, a gate insulating layer 116 is formed by depositing an inorganic insulating material, such as silicon nitride ($SiN_x$) or silicon oxide ($SiO_x$), on the first gate electrode 112, the second gate electrode 104 and the gate line 106. Subsequently, first and second active layers 118a and 120a are formed by depositing an intrinsic amorphous silicon on the gate insulating layer 116 in the switching region "S" and the driving region "D," respectively. Sequentially, first ohmic contact and second ohmic contact layers 118b and 120b are formed by depositing doped amorphous silicon on the first and second active layers 118a and 120a, respectively. The first active layer 118a and the first ohmic contact layer 118b constitute a first semiconductor layer 118, and the second active layer 120a and the second ohmic contact layer 120b constitute a second semiconductor layer 120. Next, first and second contact holes "CH1" and "CH2" are formed by etching the gate insulating layer 116 to expose a portion of the second gate electrode 104 and a portion of the first storage electrode 112.

As shown in FIGS. 9B, 10B, 11B and 12B, first source and drain electrodes 122a and 122b, second source and drain electrodes 124a and 124b, and a data line 126 (of FIG. 7) are formed by depositing layers of a conductive metallic material, such as the same material as the gate line 106 in the switching region "S," the driving region "D" and the data region "D," respectively. Further, a second storage electrode 122c extends from the first drain electrode 122b. The second gate electrode 104 is connected to the first drain electrode 122b via the first contact hole "CH1," and the second drain electrode 124b is connected to the second storage electrode 122c via the second contact hole "CH2." A data pad 128 that extends from the data line 126 is formed in a data pad region "DA."

Next, a portion of the first ohmic contact layer 118b between the first source electrode 122a and the first drain electrode 122b is removed to expose a portion of the first active layer 118a corresponding to the portion of the first ohmic contact layer 118b. Further, a portion of the second ohmic contact layer 120b between the second source electrode 124a and the second drain electrode 124b is removed to expose a portion of the second active layer 120a corresponding to the portion of the second ohmic contact layer 120b. The exposed first active and second active layers 118a and 120a act as an active channel (not shown). To reduce a channel length and to increase a channel width, the first source electrode 122a may be shaped like a "U" and the first drain electrode 122b can be shaped like a bar. In addition or in the alternative, the second source electrode 124a can be shaped like a ring while the second drain electrode 124b can be shaped like a circle. The first gate electrode 102, the first semiconductor layer 118, the first source electrode 122a, and the first drain electrode 122b constitute a switching element "Ts." The second gate electrode 104, the second semiconductor layer 120, the second source electrode 124a, and the second drain electrode 124b constitute a driving element "TD."

As shown in FIGS. 9C, 10C, 11C and 12C, a first passivation layer 130 is formed by depositing an inorganic insulating material on the switching element "Ts" and the driving element "TD." Next, an overcoat layer 132-is formed by coating an organic insulating material, such as benzocyclobutene (BCB) or acrylic resin, on the first passivation layer 130

A third contact hole "CH3" is then formed by etching the first passivation layer 130 and the overcoat layer 132 to expose a portion of the second drain electrode 124b. Further, fourth, fifth and sixth contact holes "CH4," "CH5," and "CH6" are formed by etching the first passivation layer 130 and the overcoat layer 132 to expose portions of the gate pad 108, the power pad 114, and the data pad 128, respectively.

As shown in FIGS. 9D, 10D, 11D and 12D, a first contact layer 134 is formed on the overcoat layer, and a cathode is formed on the contact layer 134. For example, the first contact layer 134 includes a metallic material having a good adhesion characteristic with the overcoat layer 132, such as Mo or ITO. The cathode can be made of one of calcium (Ca), aluminum (Al), Al alloy such as AlNd, magnesium (Mg), silver (Ag), and lithium (Li). The overcoat layer 132 acts as a planarization layer over the driving element "TD" and the step differences on the substrate 100, thereby flatting the step differences created by the array elements and contact holes amongst the array elements. Therefore, defects, such as shorting between anode electrodes due to the step differences created by spaces between the array elements, can be prevented.

The first contact layer 134 is formed to enhance the contact characteristics between the cathode and the overcoat layer. The second, third and fourth contact layers 139, 141 and 143 are formed in the same step as the first contact layer 134 using the same material as the first contact layer 134 in the gate pad region "GA," the power pad region "VA" and the data pad region "DA," respectively. A gate pad terminal 140, a power pad terminal 142 and a data pad terminal 144 are formed in the same step as the cathode 136 using the same material as the cathode 136 on the second, third and fourth contact layers 139, 141 and 143, respectively. Here, the second, third and fourth contact layers 139, 141 and 143 are disposed between the gate pad 108 and the gate pad terminal 140, between the power pad 114 and the power pad terminal 142, and between the data pad 128 and the data pad terminal 144, respectively. Therefore, the second, third and fourth contact layers 139, 141 and 143 prevent peeling of the gate pad terminal 140, the power pad terminal 142 and the data pad terminal 144 from the gate pad 108, the power pad 114 and the data pad 128, respectively.

Next, a second passivation layer 146 is formed by depositing an inorganic insulating material on the gate pad terminal 140, the power pad terminal 142 and the data pad terminal 144. The second passivation layer 146 is etched to open the gate pad terminal 140, the power pad terminal 142 and the data pad terminal 144. The second passivation layer 146 prevents shorting between emitting layers that will be formed later in each of the pixel regions "P."

As shown in FIGS. 9E, 10E, 11E and 12E, an emitting layer 148 is formed on the cathode 136 in an opening of the second passivation layer 146. An electron injection layer "EIL" is disposed on the cathode 136, an electron transport layer "ETL" is disposed on the electron injection layer "EIL," an hole transport layer "HTL" is disposed on the emitting layer 148, a hole injection layer "HIL" is disposed on the hole transport layer "HTL," and a buffer layer 150 is disposed on hole the injection layer "HIL." More specifically, the emitting layer 148 includes red (R), green (G) and blue (B) sub-emitting layers (not shown). Each of the red (R), green (G) and blue (B) sub-emitting layers is disposed in each pixel region "P." Next, an anode 152 is formed by depositing and patterning a transparent conductive material, such as indium tin oxide (ITO) or indium zinc oxide (IZO), on the buffer layer 150. Through the above-explained process, a top emission type organic ELD can be manufactured.

FIGS. 13A to 13E are cross-sectional views in accordance with a fabricating process of an organic ELD taken along line "VIIIa-VIIIa" of FIG. 7. FIGS. 14A to 14E are cross-sectional views in accordance with a fabricating process of an organic ELD along line "VIIIb-VIIIb" of FIG. 7. FIGS. 15A to 15E are cross-sectional views in accordance with a fabricating process of an organic ELD along line "VIIIc-VIIIc" of FIG. 7. FIGS. 16A to 16E are cross-sectional views in accordance with a fabricating process of an organic ELD along line "VIIId-VIIId" of FIG. 7. For convenience sake, descriptions of elements similar to those described in previously described embodiment may be omitted in this embodiment.

As shown in FIGS. 13A, 14A, 15A and 16A, an overcoat layer 332 is formed over the substrate 100 and is etched to form a third contact hole "CH33" that exposes the first passivation layer 130 corresponding to the second drain electrode 124b, and to respectively form fourth, fifth and sixth contact holes "CH33," "CH44," "CH55" that expose the first passivation layer 130 corresponding to the gate pad 108, the power pad 114 and the data pad 128. Subsequently, as shown in FIGS. 13B, 14B, 15B and 16B, a first contact layer 334 is formed by depositing an inorganic insulating material, such as silicon nitride ($SiN_x$) or silicon oxide ($SiO_x$) on the overcoat layer 332. Also, the first contact layer 334 covers the third, fourth, fifth and sixth contact holes "CH33," "CH44," "CH55" and "CH66." Then, as shown in FIGS. 13C, 14C, 15C and 16C, seventh, eighth, ninth and tenth contact holes CH77," "CH88," "CH99" and "CH10" that correspond to the third, fourth, fifth and sixth contact holes "CH33," "CH44," "CH55" and "CH66" are formed by etching the first contact layer 334 and the first passivation layer 130.

A cathode 336, a gate pad terminal 340, a power pad terminal 342, and a data pad terminal 344 are then formed on the first contact layer 334, as shown in FIGS. 13D, 14D, 15D and 16D. For example, the cathode 336 is made of one of calcium (Ca), aluminum (Al), magnesium (Mg), silver (Ag), lithium (Li) and Al alloy, such as AlNd. The cathode 336 is connected to the second drain electrode 124b via the seventh contact hole "CH77," the gate pad terminal 340 is connected to the gate pad 108 via the eighth contact hole "CH88," the power pad terminal 342 is connected to the power pad 114 via the ninth contact hole "CH99," and the data pad terminal 344 is connected to the data pad 128 via the tenth contact hole "CH10." Next, a second passivation layer 346 is formed by depositing an inorganic insulating material on the cathode 336, the gate pad terminal 340, the power pad terminal 342, and the data pad terminal 344. The second passivation 346 is etched to open the cathode 336, the gate pad terminal 340, the power pad terminal 342, and the data pad terminal 344, thereby preventing shorting between emitting layers that will be formed later in each pixel region "P."

As shown in FIGS. 13E, 14E, 15E and 16E, an emitting layer 348 is formed on the cathode 336 that is opened by the second passivation layer 346. Further, an electron injection layer "EIL" is disposed on the cathode 336, an electron transport layer "ETL" is disposed on the electron injection layer "EIL," an hole transport layer "HTL" is disposed on the emitting layer 348, a hole injection layer "HIL" is disposed on the hole transport layer "HTL," and the buffer layer 350 is disposed on hole the injection layer "HIL." More specifically, the emitting layer 348 includes red (R), green (G) and blue (B) sub-emitting layers (not shown). Each of the red (R), green (G) and blue (B) sub-emitting layers is disposed in each pixel region "P." Next, an anode 352 is formed by depositing and patterning a transparent conductive material, such as indium tin oxide (ITO) or indium zinc oxide (IZO), on the second buffer layer 350.

The organic ELD according to embodiments of the invention can be a top emission type organic ELD such that a cathode of opaque material is disposed as a lower electrode and an anode of a transparent conductive material is disposed as an upper electrode to, thereby obtaining an improved aperture ratio without being affected by the design of an array element. Further, the switching element and the driving element can be an N-type thin film transistor of amorphous silicon, thereby reducing the number of fabrication processes and product cost as well as increasing circuit stability. Such an organic ELD can include an overcoat layer between the array element and the cathode, thereby preventing shorting between anode electrodes due to the step differences of the array elements and preventing thermallization of the emitting layer. By forming the contact layer between the overcoat layer and the cathode, the defect of cathode separation from the substrate is prevented.

It will be apparent to those skilled in the art that various modifications and variations can be made in the organic electroluminescent display device and the method of fabricating the same of embodiments of the invention without departing from the sprit or scope of the invention. Thus, it is intended that embodiments of the invention cover the modifications and variations of this invention provided they come within the scope of the appended claims and their equivalents.

What is claimed is:

1. An organic electroluminescent device, comprising:
   a switching element and a driving element connected to the switching element on a substrate in a pixel region;
   an overcoat layer on the switching element and the driving element, wherein the overcoat layer has a contact hole exposing a portion of the driving element;
   a first contact layer on the overcoat layer and in the contact hole, the first contact layer being made of a metallic material;
   a cathode on the first contact layer, the cathode electrically connected to the driving element through the first contact layer;
   a passivation layer including an opening on the cathode, wherein edge portions of the cathode are covered by the passivation layer;
   an emitting layer on the cathode; and
   an anode on the emitting layer.

2. The device according to claim 1, wherein the cathode is made of one of calcium, aluminum, magnesium, silver, and lithium.

3. The device according to claim 1, wherein the anode is made of one of indium tin oxide and indium zinc oxide.

4. The device according to claim 1, further comprising an electron injection layer on the cathode, an electron transport layer on the electron injection layer, a hole transport layer on the emitting layer, a hole injection layer on the hole transport layer, and a buffer layer on the hole injection layer.

5. The device according to claim 4, wherein the buffer layer is made of one of an organic insulating material and an oxide.

6. The device according to claim 5, wherein the oxide includes vanadium pentoxide ($V_2O_5$).

7. The device according to claim 5, wherein the organic insulating material has a crystallinity and includes copper phthalocyanine (CuPc).

8. The device according to claim 1, wherein the driving element is an N-type thin film transistor including a first gate electrode, a first semiconductor layer corresponding to the first gate electrode, a first source electrode, and a first drain electrode spaced apart from the first source electrode, the first source and first drain electrodes connected to end portions of the first semiconductor layer.

9. The device according to claim 8, wherein the first drain electrode is connected to the cathode.

10. The device according to claim 8, wherein the first source electrode has a "U" shape and the first drain electrode has a bar shape.

11. The device according to claim 8, wherein the first source electrode is shaped like a ring while the first drain electrode has a circle shape.

12. The device according to claim 1, further comprising gate and data lines connected to the switching element and crossing each other to define the pixel region, and a power line crossing one of the gate line and the data line.

13. The device according to claim 12, wherein the gate line, the data line and the power line include a gate pad, a data pad and a power pad at end portions thereof, respectively.

14. The device according to claim 12, wherein the switching element includes a second gate electrode connected to the gate line, a second semiconductor layer corresponding to the second gate electrode, a second source electrode connected to the data line, and a second drain electrode spaced apart from each other, the second source and second drain electrodes connected to end portions of the second semiconductor layer.

15. The device according to claim 14, further comprising a storage capacitor including a first storage electrode connected to the power line, a second storage electrode connected to the second drain electrode, and an insulating layer between the first and second storage electrodes.

16. The device according to claim 1, wherein the overcoat layer includes an organic insulating material.

17. The device according to claim 16, wherein the organic insulating material includes one of benzocyclobutene and acrylic resin.

18. The device according to claim 1, further comprising a passivation layer between the switching element and the overcoat layer and between the driving element and the overcoat layer.

19. The device according to claim 18, wherein the passivation layer includes an inorganic insulating material.

20. An organic electroluminescent device, comprising:
   a switching element and a driving element connected to the switching element on a substrate in a pixel region;
   an overcoat layer on the switching element and the driving element;
   a contact layer made of inorganic insulating layer on the overcoat layer, wherein the overcoat layer and the contact layer has a contact hole that exposes a portion of the driving element;
   a cathode on the contact layer, the cathode electrically connected to the driving element via the contact hole;
   a passivation layer including an opening on the cathode, wherein edge portions of the cathode are covered by the passivation layer;
   an emitting layer on the cathode; and
   an anode on the emitting layer.

* * * * *